(12) United States Patent
Matsumoto

(10) Patent No.: US 7,190,455 B2
(45) Date of Patent: Mar. 13, 2007

(54) ALIGNMENT METHOD AND APPARATUS AND EXPOSURE APPARATUS

(75) Inventor: Takahiro Matsumoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 381 days.

(21) Appl. No.: 10/762,599

(22) Filed: Jan. 21, 2004

(65) Prior Publication Data
US 2004/0150824 A1 Aug. 5, 2004

(30) Foreign Application Priority Data
Jan. 22, 2003 (JP) ............................. 2003-014025

(51) Int. Cl.
*G01B 11/00* (2006.01)
*G06F 17/50* (2006.01)

(52) U.S. Cl. ........................................ 356/401; 716/19

(58) Field of Classification Search ................ 250/548; 355/53, 55; 356/399–401; 382/151; 430/5, 430/22, 30; 716/19
See application file for complete search history.

(56) References Cited

U.S. PATENT DOCUMENTS

| | | | |
|---|---|---|---|
| 4,070,117 A * | 1/1978 | Johannsmeier et al. ..... 356/401 |
| 4,962,318 A * | 10/1990 | Nishi .......................... 250/548 |
| 5,525,808 A | 6/1996 | Irie et al. ..................... 250/548 |
| 5,561,606 A * | 10/1996 | Ota et al. ....................... 716/19 |
| 5,740,065 A * | 4/1998 | Jang et al. ...................... 716/1 |
| 5,754,300 A * | 5/1998 | Magome et al. ............ 356/401 |
| 5,805,866 A * | 9/1998 | Magome et al. .............. 716/19 |
| 5,859,707 A * | 1/1999 | Nakagawa et al. ......... 356/401 |
| 5,943,135 A * | 8/1999 | Mishima ..................... 356/401 |
| 6,914,664 B2 * | 7/2005 | Best et al. ..................... 355/53 |
| 7,019,836 B2 * | 3/2006 | Mishima ..................... 356/401 |
| 2001/0007498 A1 * | 7/2001 | Arai et al. .................. 356/401 |

\* cited by examiner

Primary Examiner—Layla G. Lauchman
Assistant Examiner—Jarreas C. Underwood
(74) Attorney, Agent, or Firm—Morgan & Finnegan, LLP

(57) ABSTRACT

A method for detecting disposition of plurality of exposure shot areas of an object that is to be exposed includes a first detection step of detecting the alignment marks on the object, an evaluation step of evaluating randomness of the alignment marks based on the detection result by the first detection step, a determination step of determining a number smaller than the total number of alignment marks on the object based on the evaluation result by the evaluation step, and a second detection step of detecting the disposition of the plurality of exposure shot areas by detecting alignment marks corresponding to the number determined by the determination step.

2 Claims, 18 Drawing Sheets

T

S

E

ALIGNMENT METHOD AND APPARATUS AND EXPOSURE APPARATUS

This application claims a benefit of foreign priority based on Japanese Patent Application No. 2003-014025, filed on Jan. 22, 2003, which is hereby incorporated by reference herein in its entirety as if fully set forth herein.

BACKGROUND OF THE INVENTION

The present invention relates to a position detecting method and apparatus, and more particularly to an alignment apparatus mounted on a semiconductor exposure apparatus and an overlay inspection apparatus used to evaluate the alignment accuracy and to calculate an offset. The present invention is suitable, for example, for a position detecting method and apparatus used for global alignment to a wafer having plural shot areas and alignment marks corresponding to respective shot areas.

Projection exposure apparatuses used to manufacture semiconductor devices have been required to expose a circuit pattern on a reticle (or a mask) onto a wafer with higher resolution along with recent demands for finer and higher density circuits. The exposure apparatus is also required to facilitate an exposure process; for example, the flat processing technology, such as a chemical mechanical polishing ("CMP") process, has been introduced for the increased depth of focus and easy exposure.

One important exposure parameter is the overlay accuracy that is accuracy in overlaying plural patterns on a wafer. The desired overlay accuracy needs highly precise alignment between a reticle and a wafer, and the alignment accuracy has become increasingly strict on demand for a finer circuit pattern. The necessary alignment accuracy is typically about one-third as large as a circuit's critical dimension; for example, 60 nm that is one-third as large as the current design width of 180 nm.

For an alignment between each shot on a wafer and a reticle, it is necessary to simultaneously and optically detect a circuit pattern on the reticle and an alignment mark that corresponds to each shot for exposure on the wafer, and to position the wafer relative to the reticle based on the detection result.

The common global alignment measures position coordinates of plural sample shots on the wafer, statistically processes the measurement values, calculates wafer's shift, magnification and rotational error, corrects the wafer coordinate, and moves to a next shot stepwise. The recently used advanced global alignment ("AGA") develops the global alignment, relies upon the accuracy of an XY stage including a laser interferometer, measures wafer positions, calculates the wafer's magnification and rotational and shift amounts, and performs a statistic process, such as an abnormal value jump, etc.

Means for detecting an alignment mark includes a method for imaging an enlarged alignment mark through a microscope and for detecting a position of a mark image, a method for using a diffraction grating as an alignment mark, for detecting a phase of an interference signal through interference of the diffracted light, and for detecting a position of the diffraction grating, etc.

The improved overlay accuracy is vital for improved performance of semiconductor devices and enhanced manufacture yield. An introduction of special semiconductor manufacture technology, such as a CMP process, however, would cause alignment marks to have non-uniform shapes among wafers and shots, and disadvantageously deteriorate the alignment accuracy. This is because a demand for a finer circuit pattern has increased a difference in critical dimension between a circuit pattern and an alignment mark, and optimized process conditions, such as a film formation, etching, and CMP, for the finer circuit pattern (with a critical dimension from 0.1 to 0.15 µm), not for the wider alignment mark (with a critical dimension from 0.6 to 4.0 µm).

Expectedly, it will be increasingly difficult in the future to manufacture both a circuit pattern and an alignment mark on the same wafer surface without defects due to a demand for a finer circuit pattern, an introduction of a new semiconductor process, a larger wafer diameter up to 300 mm, etc. In addition, due to metal grains, a metal layer would face disadvantages in deteriorated S/N in an alignment signal and the lowered alignment accuracy.

If each alignment mark is designed to arrange, for example, four mark elements at regular intervals, the lowered alignment accuracy means that three mark-element intervals are detected differently. The conventional global alignment has not yet proposed a method for maintaining the predetermined alignment accuracy for scattering detection result of the alignment mark. Although the global alignment would be able to provide more reliable statistic calculations with detection information of alignment marks for all the shots on a wafer, this would lower the throughput and increase the cost.

BRIEF SUMMARY OF THE INVENTION

Accordingly, it is an exemplified object of the present invention to provide an alignment apparatus and method, and an exposure apparatus, which reconcile the necessary alignment accuracy and throughput even for a scattering detection result of an alignment mark.

A method of one aspect according to the present invention for detecting disposition of plurality of exposure shot areas of an object that is to be exposed includes a first detection step of detecting the alignment marks on the object, an evaluation step of evaluating randomness of the alignment marks based on the detection result by the first detection step, a determination step of determining a number smaller than the total number of alignment marks on the object based on the evaluation result by the evaluation step, and a second detection step of detecting the disposition of the plurality of exposure shot areas by detecting alignment marks corresponding to the number determined by the determination step.

The evaluation step may evaluate positional detection accuracy of the alignment marks based on the detection result the first detection step. The alignment mark may include plural mark elements, wherein the evaluation step may evaluate an interval between the mark elements detected by the first detection step. The determination step may determine a minimum natural number Ns that meets $Ns \geq \alpha \cdot (Mr/Ar)^2/Nm$, where Mr is reproducibility of the interval between the mark elements, Nm is the number of mark elements included in each alignment mark, Ar is required accuracy, and $\alpha$ ($1 \leq \alpha \leq 3$) is a corrective coefficient. The determination step determines a minimum natural number Ns that meets $Ns \geq \alpha \cdot f(Nm, Mr, Ar)$, where Mr is reproducibility of the interval between the mark elements, Nm is the number of mark elements included in each alignment mark, Ar is required alignment accuracy, $\alpha(1 \leq \alpha \leq 3)$ is a corrective coefficient, and f is a predetermined function.

The alignment mark may include plural mark elements, wherein the evaluation step includes the steps of calculating a difference between an average among measurement values of positions of all the mark elements, and the measurement value of the position of the mark element, and calculating reproducibility of the difference.

An apparatus of another aspect according to the present invention for detecting dispositions of a plurality of exposure shot areas of an object that is to be exposed includes a detector for detecting the alignment marks on the object, a processor for evaluating randomness of the alignment marks based on the detection result by the detector, a controller for determining a number smaller than the total number of alignment marks on the object based on the evaluation result by the processor, and a second detector for detecting the dispositions of the plurality of exposure shot areas by detecting alignment marks corresponding to the number determined by the controller. The apparatus may further include an input part for inputting required alignment accuracy.

An exposure apparatus that includes the above apparatus also constitutes another aspect of the present invention.

An overlay inspection method of still another aspect according to the present invention for inspecting an overlay state between first and second patterns for plural shots, a film being formed on the first pattern, and the second pattern being formed on the film includes a first detection step of detecting measurement marks corresponding to three or more shots (Ns1), a determination step of determining the number (Ns) of necessary shots for satisfying required detection accuracy based on a detection result by the first detection step, and a second detection step of detecting measurement marks corresponding to the number (Ns) of shots, from which the detected shots (Ns1) are subtracted.

An overlay inspection apparatus of another aspect according to the present invention for inspecting an overlay state between first and second patterns for plural shots, a film being formed on the first pattern, and the second pattern being formed on the film includes a detector for detecting a measurement mark corresponding to the shot, and a controller for determining the number (Ns) of necessary shots for satisfying required detection accuracy based on a detection result by the detector of the measurement marks.

Other objects and further features of the present invention will become readily apparent from the following description of the embodiments with reference to accompanying drawings.

DETAILED DESCRIPTION OF THE PREFERRED EMBODIMENTS

Figure 2:
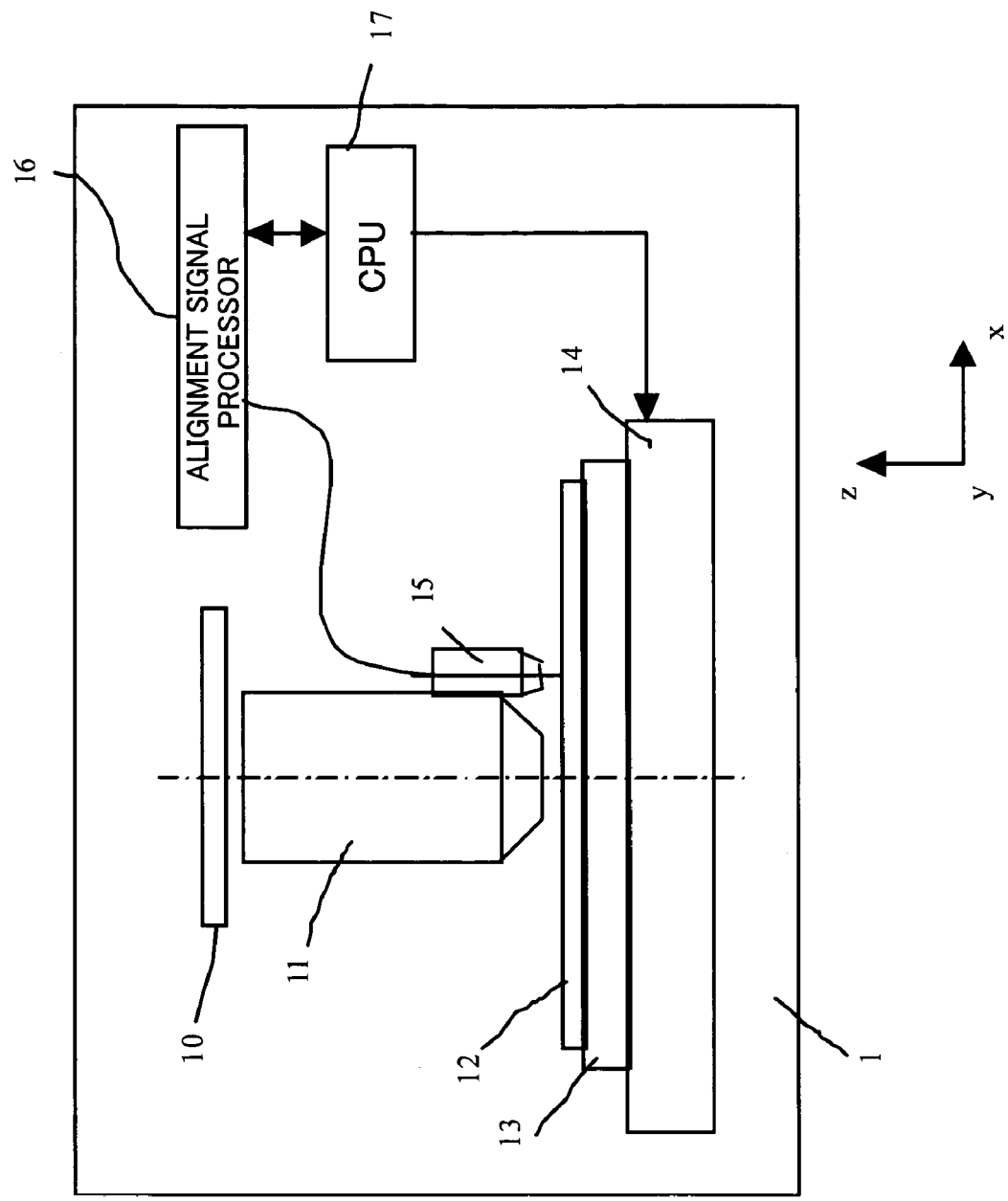
FIG. 2 is a schematic view of an exposure apparatus of one embodiment according to the present invention.

A detailed description will now be given of the preferred embodiments according to the present invention, with reference to accompanying drawings. FIG. 2 is a schematic view of principal parts an inventive semiconductor exposure apparatus 1. The exposure apparatus 1 includes a projection optical system 11 for projecting a reduced size of a reticle 10 that forms a certain pattern (such as a circuit pattern), a wafer chuck 13 that holds a wafer 12 onto which a primary coat pattern and alignment marks have been formed in a pretreatment step, a wafer stage 14 that positions the wafer 12 at a predetermined position, an alignment optical system (or alignment scope) 15 that measures a position of the alignment mark 30 on the wafer 12, etc.

Figure 3:
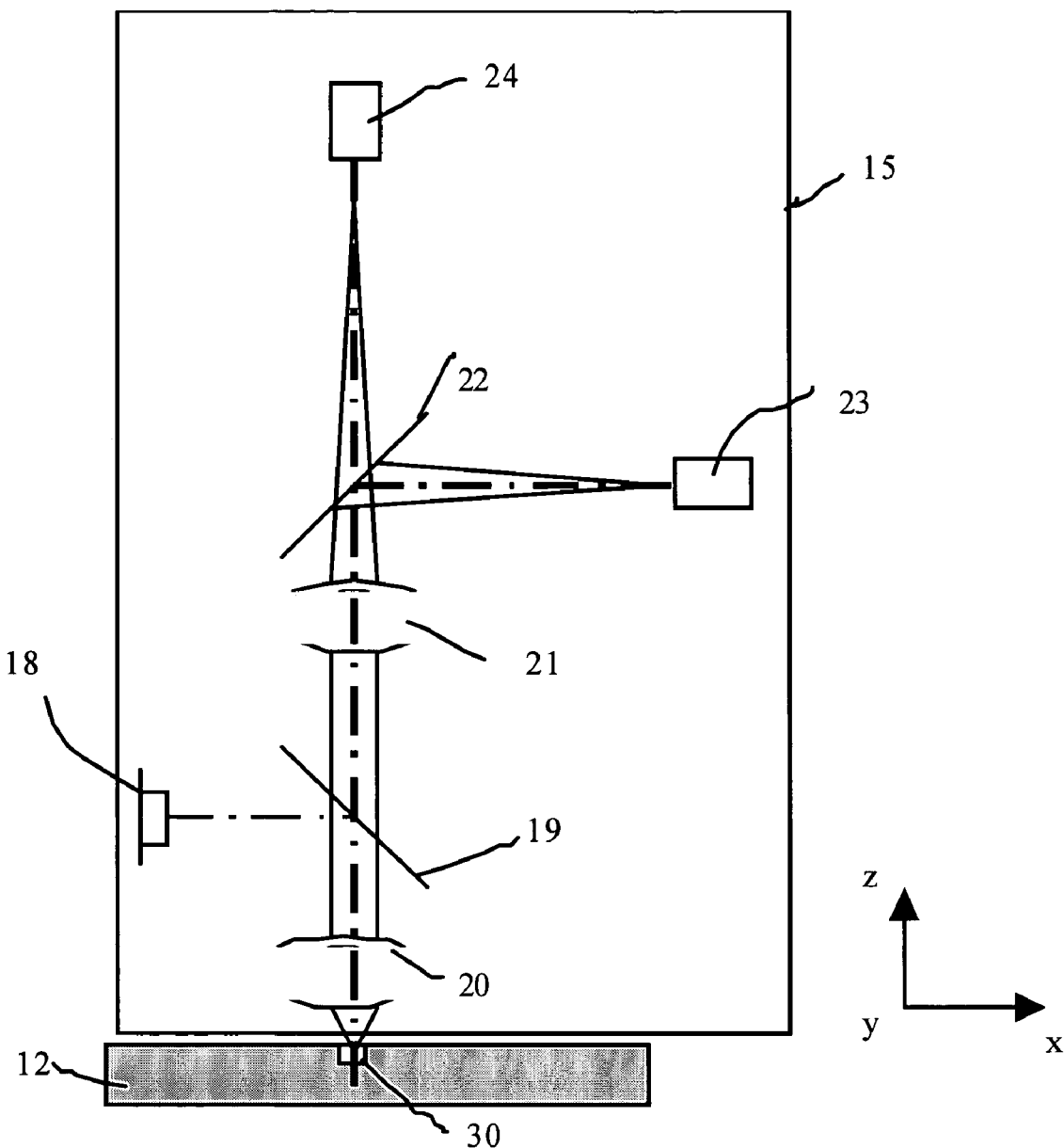
FIG. 3 shows a view of an alignment scope of one embodiment according to the present invention, which is applicable to the exposure apparatus shown in FIG. 2.

A description will now be given of the detection principle of an alignment mark. FIG. 3 shows an optical path that passes through principal elements in the alignment optical system 15. The illumination light from a light source 18 passes through a lens 20 after reflected on a beam splitter 19, and illuminates an alignment mark 30 on the wafer 12. The (reflected or diffracted) light from the alignment mark 30 passes through the lens 20, the beam splitter 19, and a lens 21, and is divided by a beam splitter 22, and received by CCD or area sensors 23 and 24. The alignment mark 30 is magnified at imaging magnification of about 100 times, and imaged on the CCD sensors 23 and 24. The CCD sensors 23 and 24 are used to measure offsets of the alignment mark 30 in directions X and Y, respectively, and arranged at a rotational angle of 90° relative to the optical axis. The CCD sensor may use a line sensor, which preferably uses, in this case, a cylindrical lens having power in a direction perpendicular to the measurement direction for condensation in the direction perpendicular to the measurement direction, optical integration and averaging.

Figure 4:
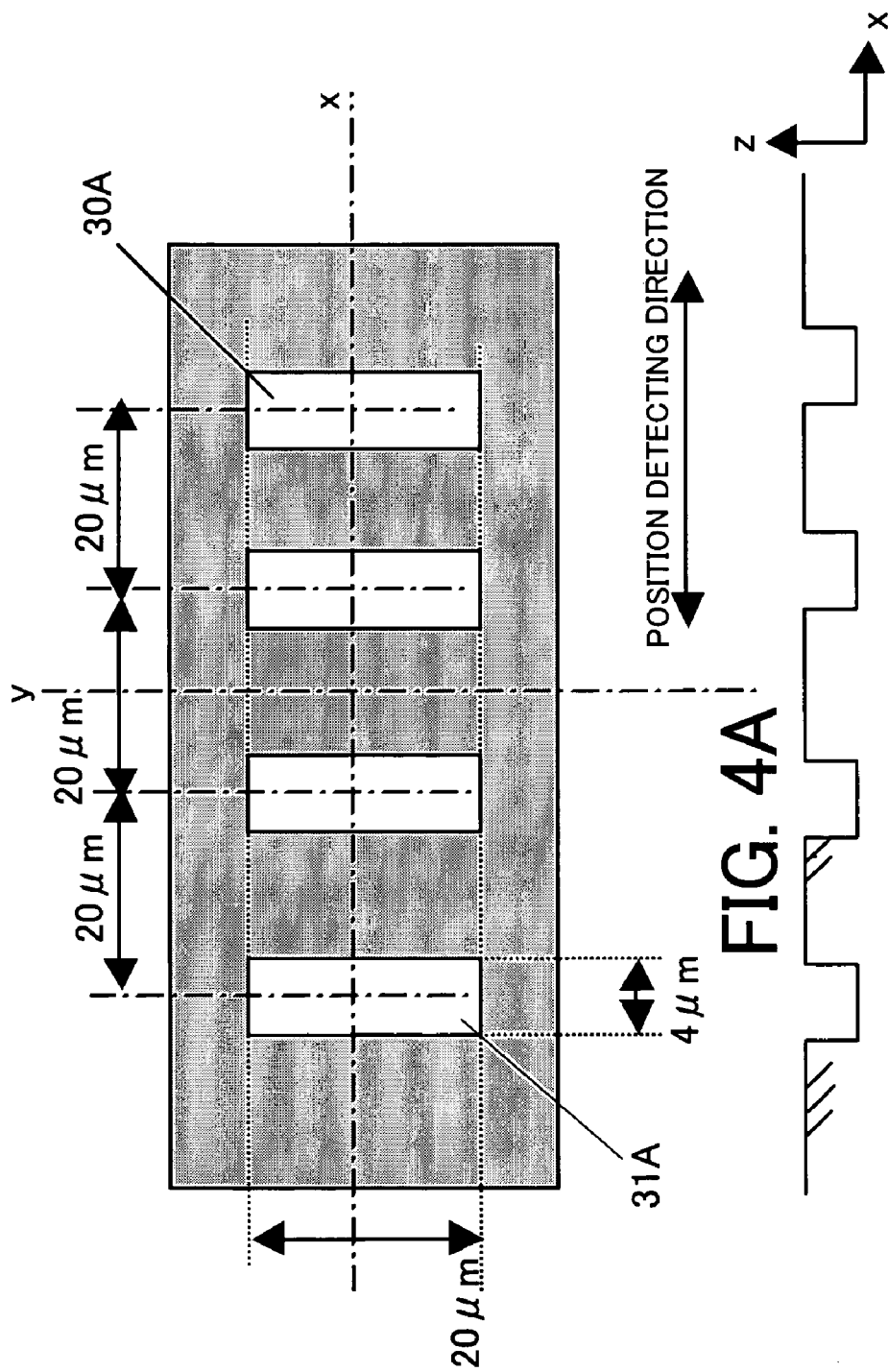
FIG. 4 is a plane view showing one example of an alignment mark shown in FIG. 2.
Figure 5:
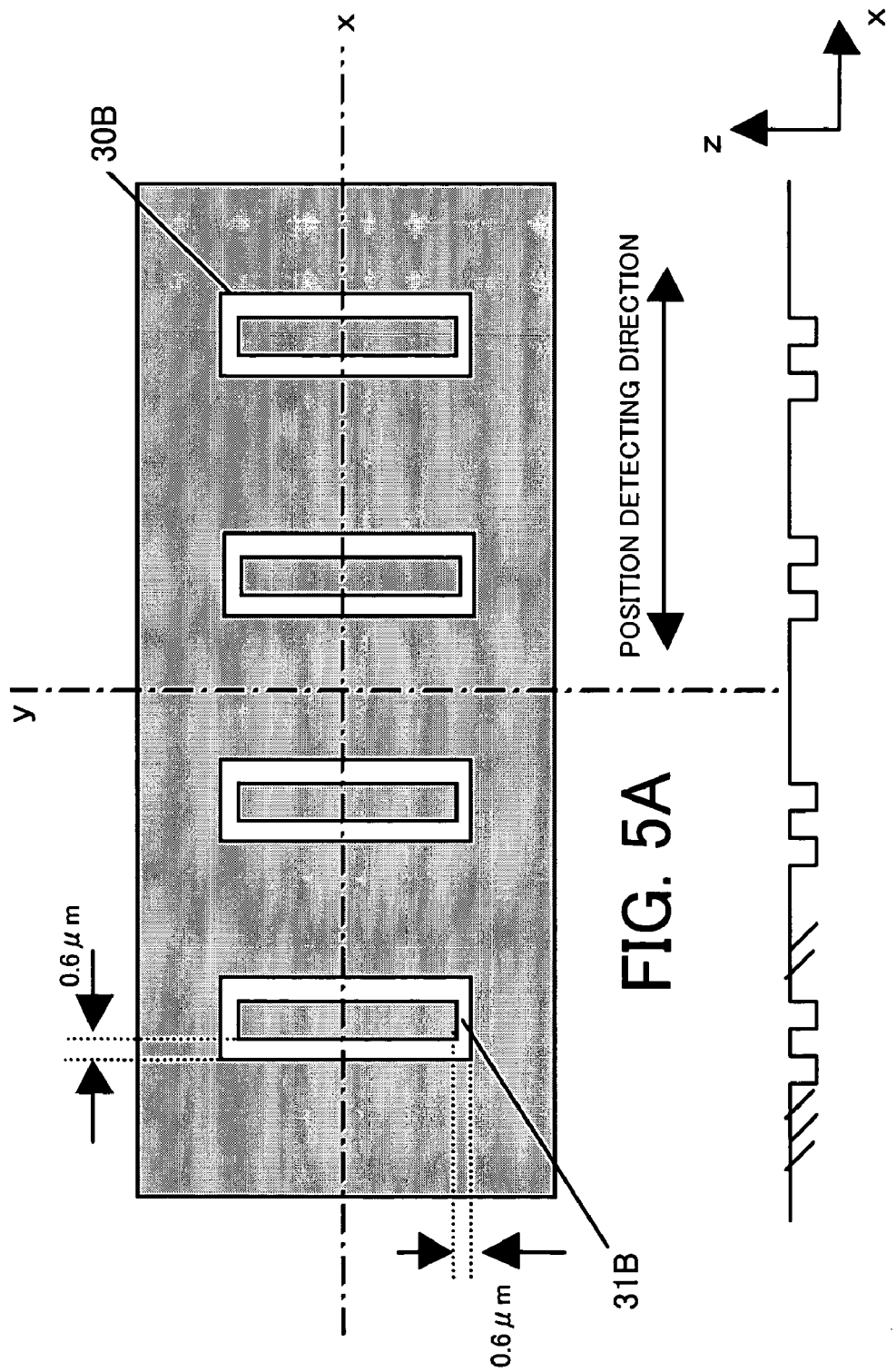
FIG. 5 is a plane view showing another example of an alignment mark shown in FIG. 2.

The alignment marks 30 are arranged on a scribe line for each shot and may use, for example, alignment marks 30A and 30B shown in FIGS. 4 and 5. Reference numeral 30 generalizes reference numerals 30A and 30B. Here, FIGS. 4A and 4B are plane and sectional views of the alignment mark 30A. FIGS. 5A and 5B are plane and sectional views of the alignment mark 30B. In FIGS. 4 and 5, each of the alignment marks 30A and 30B include four mark elements 31A and 31B arranged at regular intervals. A mark element 31 is used as generic term of the mark element 31A and mark element 31B.

The alignment mark 30A in FIG. 4 arranges four rectangular mark elements 31A at a pitch of 20 μm in a direction X, each of which has a size of 4 μm in a measurement direction X and 20 μm in a non-measurement direction Y. The alignment mark 30A has a concave sectional shape as shown in FIG. 4B. Although the alignment mark 30A actually applies resist onto its surface, but FIG. 4B omits the resist. The alignment mark 30B in FIG. 5 replaces a contour of the mark element 31A in FIG. 4 with a line width (critical dimension) of 0.6 μm.

Figure 6:
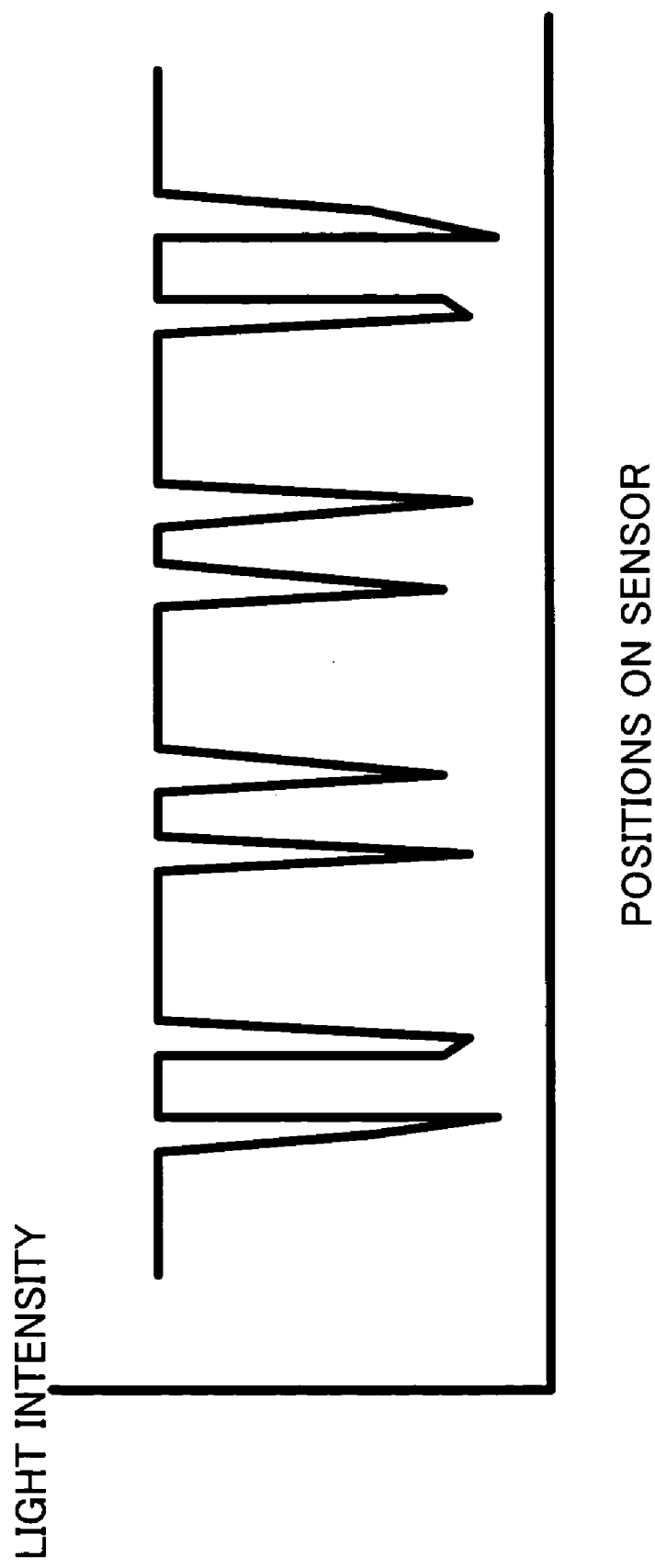
FIG. 6 is a graph showing a typical detection result when the alignment marks shown in FIGS. 4 and 5 are optically detected.

Whichever is used, the alignment mark 30A or 30B in FIG. 4 or 5, the CCD sensor 23 generally takes an image as shown in FIG. 6, due to a generation and interference of scattered light at a lens' edge outside its NA in the alignment optical system 15. The alignment mark 30A has a dark contour, while the alignment mark 30B has a dark or bright concave part, as characterized and often observed by the bright field.

Figure 7A:
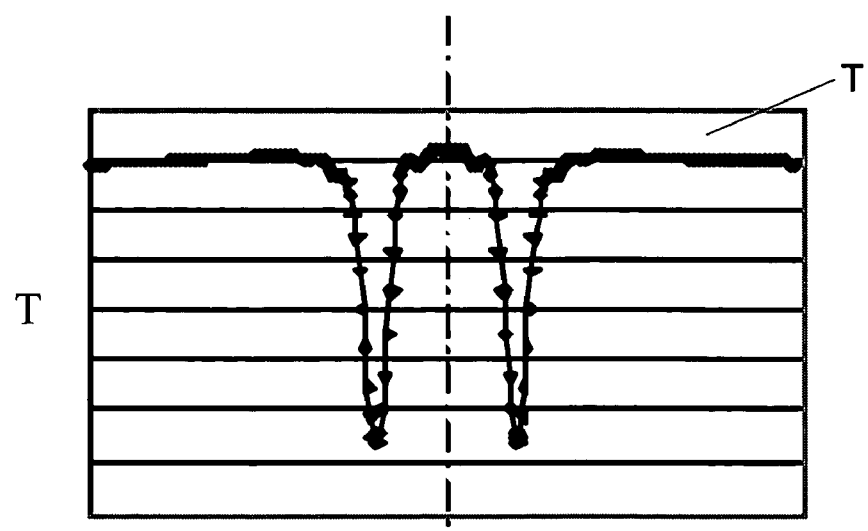
FIG. 7 is template matching applicable to the detection result shown in FIG. 6.
Figure 7B:
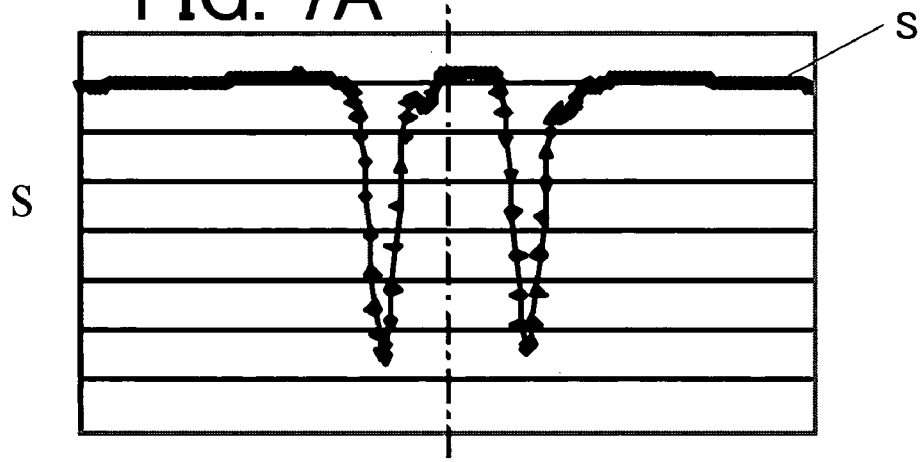
Figure 7C:
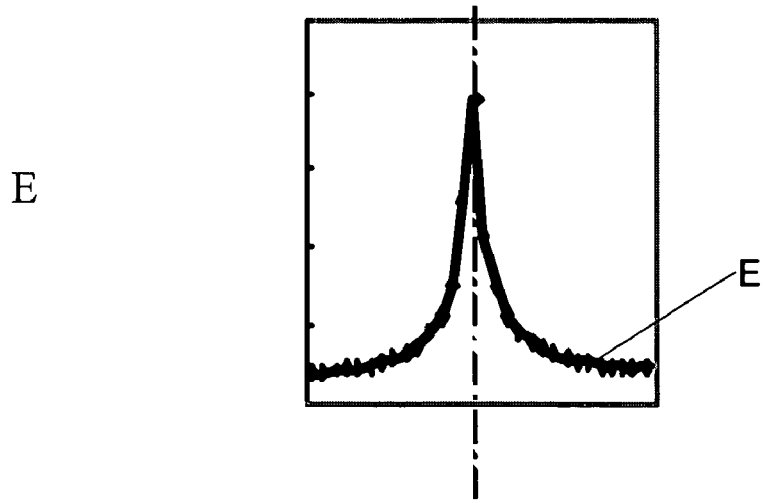

Alignment signal processor 16 processes an image of the alignment mark 30, which has been thus taken. The instant embodiment uses template matching to calculate a position of an alignment mark. The template matching correlates an obtained signal S shown in FIG. 7B with a template T shown in FIG. 7A that has been stored in the apparatus, and detects the position having the highest correlation as a center of the alignment mark. Resolutions 1/10 to 1/50 can be selected by calculating a barycenter pixel position in an area that ranges several pixels to the right and left from the peak pixel using a correlation-value function E shown in FIG. 7C. The template matching uses the following equation, where S is a signal obtained by the sensor, T is a template, and E is a correlation value or result:

$$E(X) = \frac{1}{\sum_{J=-k}^{k} [S(X+J) - T(J)]^2} \quad (1)$$

FIG. 7 shows a relationship among the signal S, template T, and correlation values E. FIG. 7 shows processing to one mark-element image among four mark elements 31. Here, X that maximizes the correlation value E(X) is considered to be a position of the mark image. As applied similarly hereinafter, the template matching detects image positions on the sensor for other three mark elements 31. The template matching calculates mark-element image positions $X1(i)$, $X2(i)$, $X3(i)$ and $X4(i)$ (with unit of pixel), where "i" is a shot number. The following equation calculates averaged positions of respective mark elements:

$$Xa(i) = [X1(i) + X2(i) + X3(i) + X4(i)]/4 \quad (2)$$

The following equation calculates a positional offset of the alignment mark 30 on the wafer 12, which has been obtained for each template, where M is an imaging magnification of the alignment scope 15, and Px is a pixel pitch of the area sensor 23 in the alignment measurement direction:

$$Xw(i) = Xa(i)/(Px \cdot M) \quad (3)$$

A variation of this signal processing of the instant embodiment can use known signal processing to detect a position of the alignment-mark image, such as a slice method, a method for calculating the maximum slope position using a differential signal, and a return symmetric processing.

A description will now be given of an alignment method for the wafer 12 based on measurement values of positions of the alignment mark 30. The instant embodiment adopts AGA, which selects some shots (these selected shots are referred to as "sample shots") among all the shots (or chips) on a wafer, and detects positions of the alignment marks in the shots.

Figure 8:
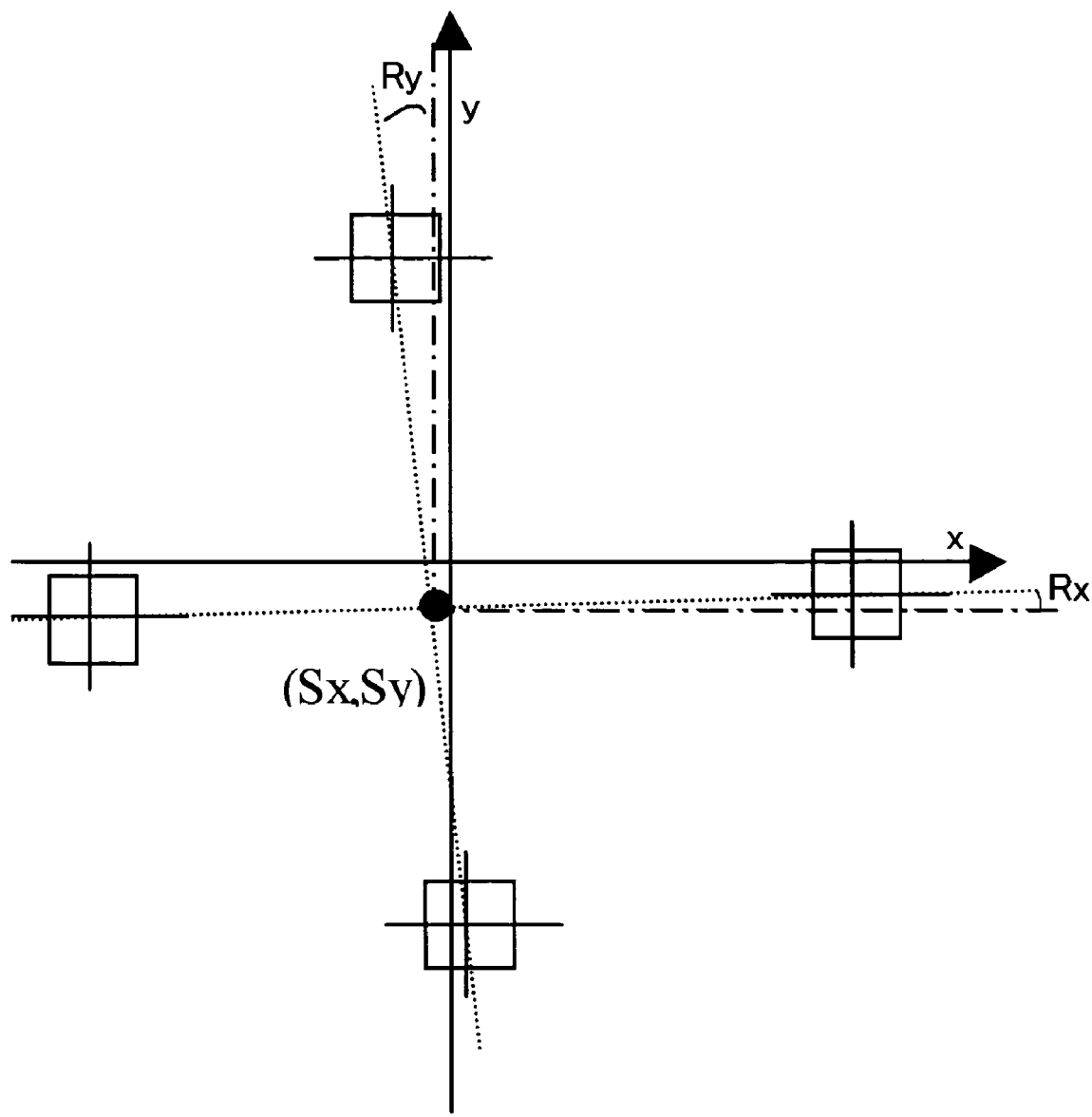
FIG. 8 is a view for explaining the global alignment.

FIG. 8 shows an offsetting shot arrangement on the wafer 12 relative to the xy coordinate on the wafer stage 14 in the exposure apparatus 1. An offset of the wafer 12 can be described with six parameters including a shift Sx in the direction x, a shift Sy in the direction y, an inclination θx to the x-axis, an inclination θy to the y-axis, a magnification Bx in the direction x, and a magnification By in the direction y. Bx and By represent an expansion and contraction of the wafer 12 based on wafer stage feeding in the exposure apparatus 1, and are caused by a film formation and etching in the semiconductor process.

Here, the following equation defines measurement values Ai for AGA sample shots measured by the above method (where "i" is a measurement shot number):

$$Ai = \begin{bmatrix} xi \\ yi \end{bmatrix} \quad (4)$$

The following equation describes designed positional coordinates Di of the alignment marks 30 for the sample shots:

$$Di = \begin{bmatrix} Xi \\ Yi \end{bmatrix} \quad (5)$$

AGA conducts the following primary coordinate conversion D'i using the above six parameters (Sx, Sy, θx, θy, Bx, By) that represent wafer's positional offsets:

$$D'i = \begin{pmatrix} Bx & -\theta y \\ \theta x & By \end{pmatrix} Di + \begin{pmatrix} Sx \\ Sy \end{pmatrix} \quad (6)$$

Equation 6 approximated θx and θy are minute (≈0) and Bx=By≈1, cos θ=1, sin θ=θ, θx·Bx=θx, θy·By=θy, etc.

Figure 9:
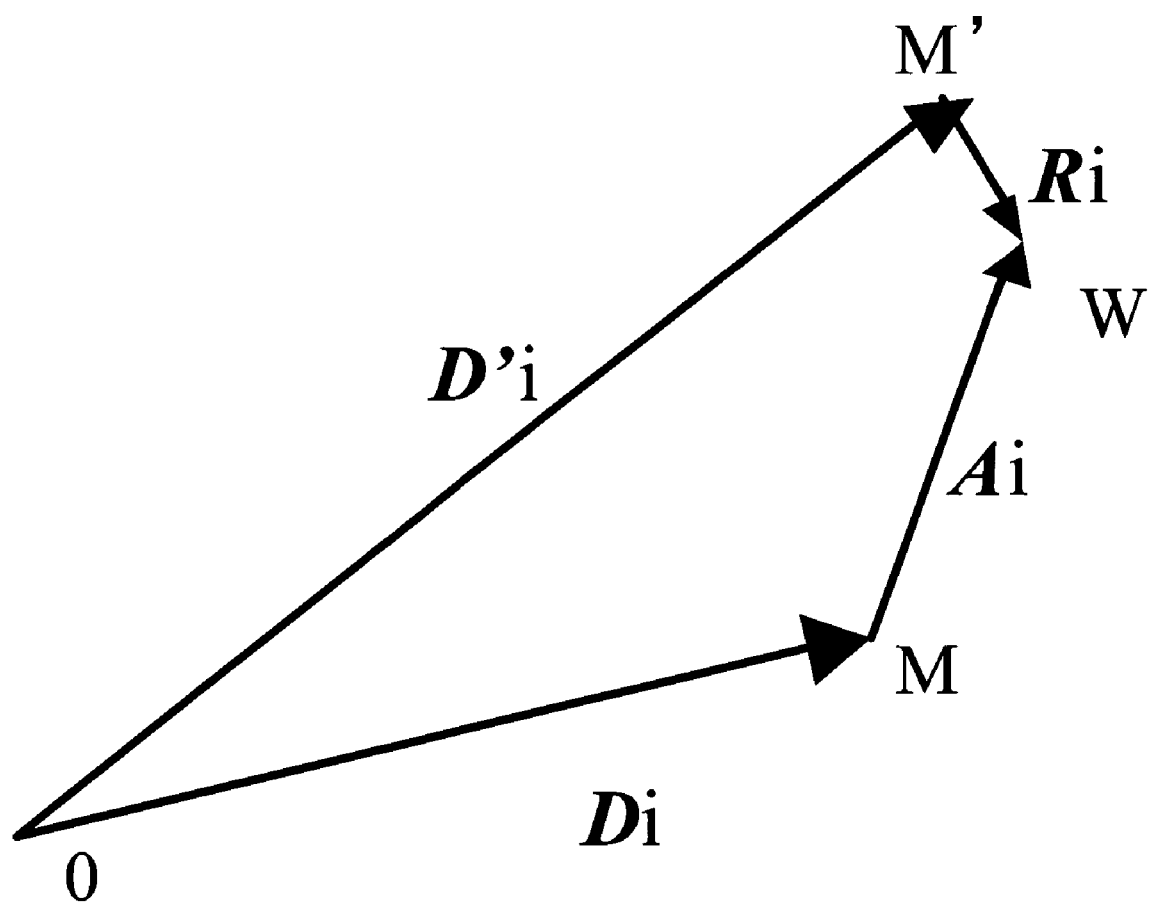
FIG. 9 is a view showing a linear coordinate conversion and a corrective residual.

FIG. 9 shows a primary coordinate conversion of Equation 6. The alignment mark 30 is located at a position W on the wafer 12, offset by Ai from a position M as a designed position, and shows a positional offset (or residue) Ri after the coordinate conversion D'i:

$$Ri = (Di + Ai) - D'i \quad (7)$$

AGA adopts the least square method to minimize the residue Ri for each sample shot, or calculates (Sx, Sy, θx, θy, Bx, By) that minimizes averaged square sum of the residue Ri:

$$V = \frac{1}{n} \sum |Ri|^2 \quad (8)$$

-continued $$= \frac{1}{n}\sum_{i=1}^{i=n}\left|\begin{pmatrix} xi \\ yi \end{pmatrix} - \begin{pmatrix} Bx-1 & -\theta y \\ \theta x & By-1 \end{pmatrix}\begin{pmatrix} Xi \\ Yi \end{pmatrix} - \begin{pmatrix} Sx \\ Xy \end{pmatrix}\right|^2$$

$$\begin{pmatrix} \delta V/\delta Sx \\ \delta V/\delta Sy \\ \delta V/\delta Rx \\ \delta V/\delta Ry \\ \delta V/\delta Bx \\ \delta V/\delta By \end{pmatrix} = 0 \qquad (9)$$

AGA parameters (Sx, Sy, θx, θy, Bx, By) are obtained by substituting for Equations 8 and 9, measurement values (xi, yi) for each sample shot and alignment-mark designed position (Xi, Yi).

Figure 10:
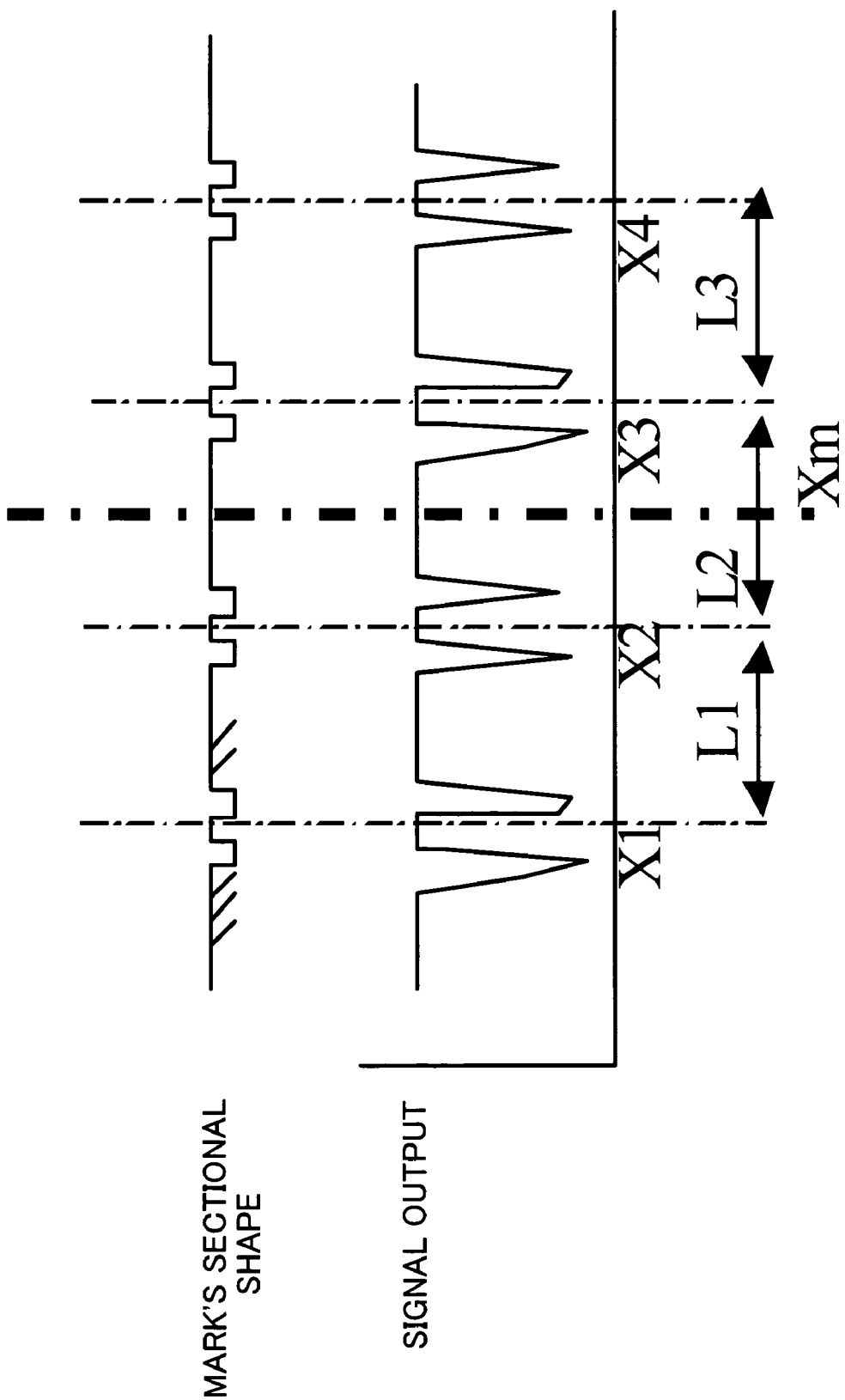
FIG. 10 is a view for explaining an interval between mark elements.

Referring now to FIG. 10, a description will be given of relationships among the measurement reproducibility of the mark elements 31, the interval reproducibility of the mark elements 31, and the measurement reproducibility of the alignment mark 30. Here, FIG. 10 exemplarily shows a sectional shape of the alignment mark 30, and an alignment signal. As illustrated, three mark-element intervals (L1, L2, L3) can be calculated from positional measurement values X1 to X4 of four mark elements 31 in the alignment mark 30. More specifically, Equations 10 to 12 below can calculate a mark-element interval (or an interval between mark elements):

$$L1(i)=X2(i)-X1(i) \qquad (10)$$

$$L2(i)=X3(i)-X2(i) \qquad (11)$$

$$L3(i)=X4(i)-X3(i) \qquad (12)$$

While the instant embodiment sets the number of marks to be four, the present invention does not limit the number of mark elements, and the number of mark elements is variable within a permissible range of the total area of the alignment mark 30. For example, data of (n−1) mark-element intervals results from "n" mark elements.

Mark-element intervals L are detected as an equal value when the alignment mark 30 is uniformly formed on the wafer 12, and scatter, for example, when mark shapes scatter due to influence of metal grains. Since the mark-element interval is a difference between mark-element measurement values, $\sigma x^2 + \sigma y^2 = \sigma L^2$ is met where σx is a standard deviation of detected values of positions of respective mark elements 31, and represents reproducibility or accuracy, σL is a standard deviation of scattering mark-element intervals, and the number of samples is 3·the number of measurement shots.

Since the measurement value of the alignment mark is an average of four mark elements, the standard deviation σax of the scatter becomes $\sigma ax = \sigma x/\sqrt{4}$. Thus, the following equation expresses the scatter (reproducibility or accuracy) 3σax of positional detection value of the alignment mark using the mark-element interval reproducibility 3σL (or the reproducibility of intervals between mark elements). Here, three times of σ covers the whole of 99.7%, and three times of the standard deviation is generally used to discuss the accuracy or reproducibility:

$$3\sigma ax = 3\sigma x/2 = 3\sigma L/2\sqrt{2} \qquad (13)$$

For an alignment mark with "n" mark elements, 3σax is given by the equation below:

$$3\sigma ax = \frac{3\sigma L}{\sqrt{2n}} \qquad (14)$$

Thus, the positional measurement reproducibility of the alignment mark 30, which cannot be directly evaluated, is obtained by evaluating and substituting for Equation 13 or 14 the mark-element interval reproducibility.

Figure 1:
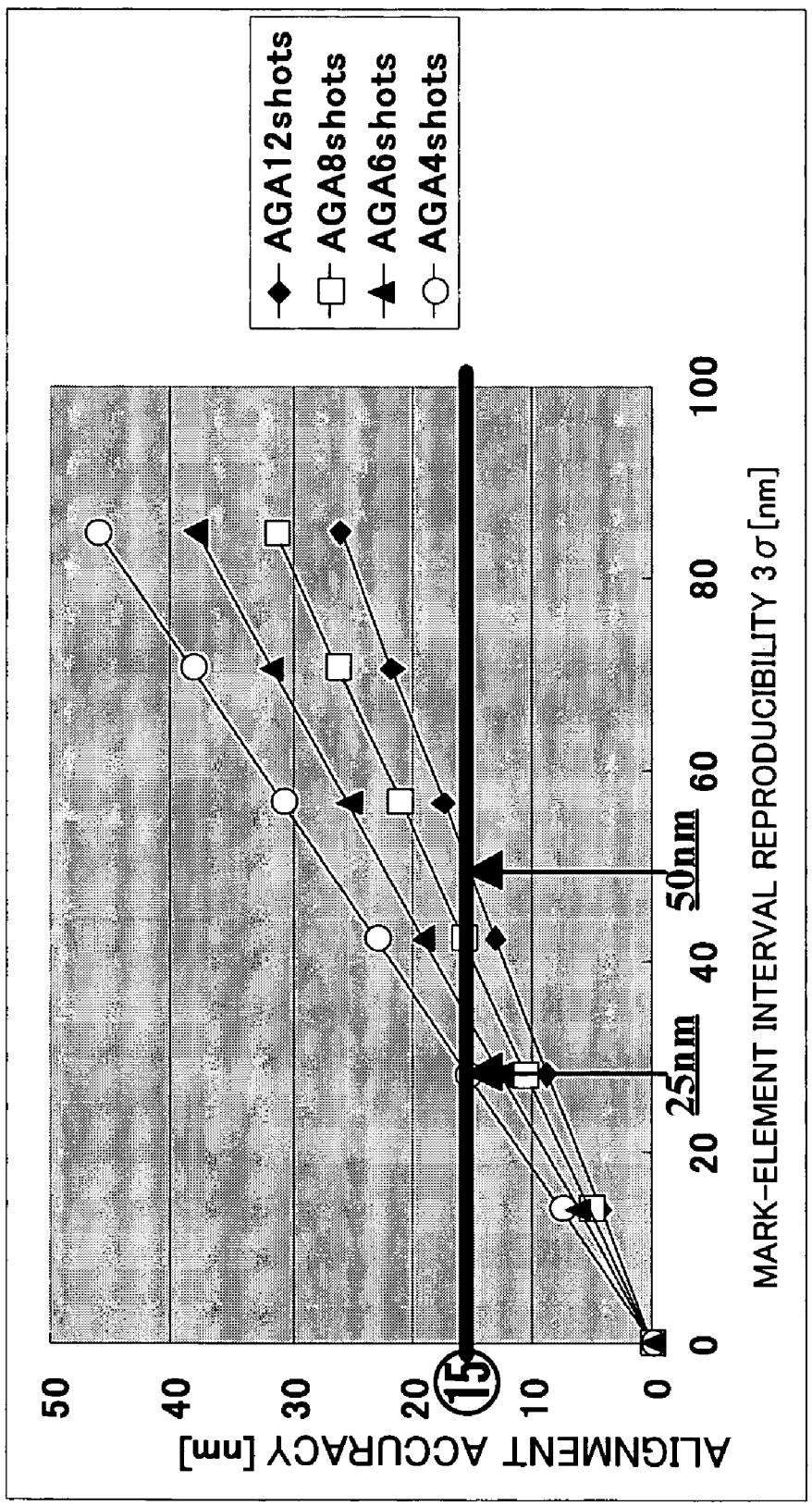
FIG. 1 is a graph showing a relationship among the reproducibility of intervals between mark elements, the number of shots to be measured for alignment, and the alignment accuracy.
Figure 11:
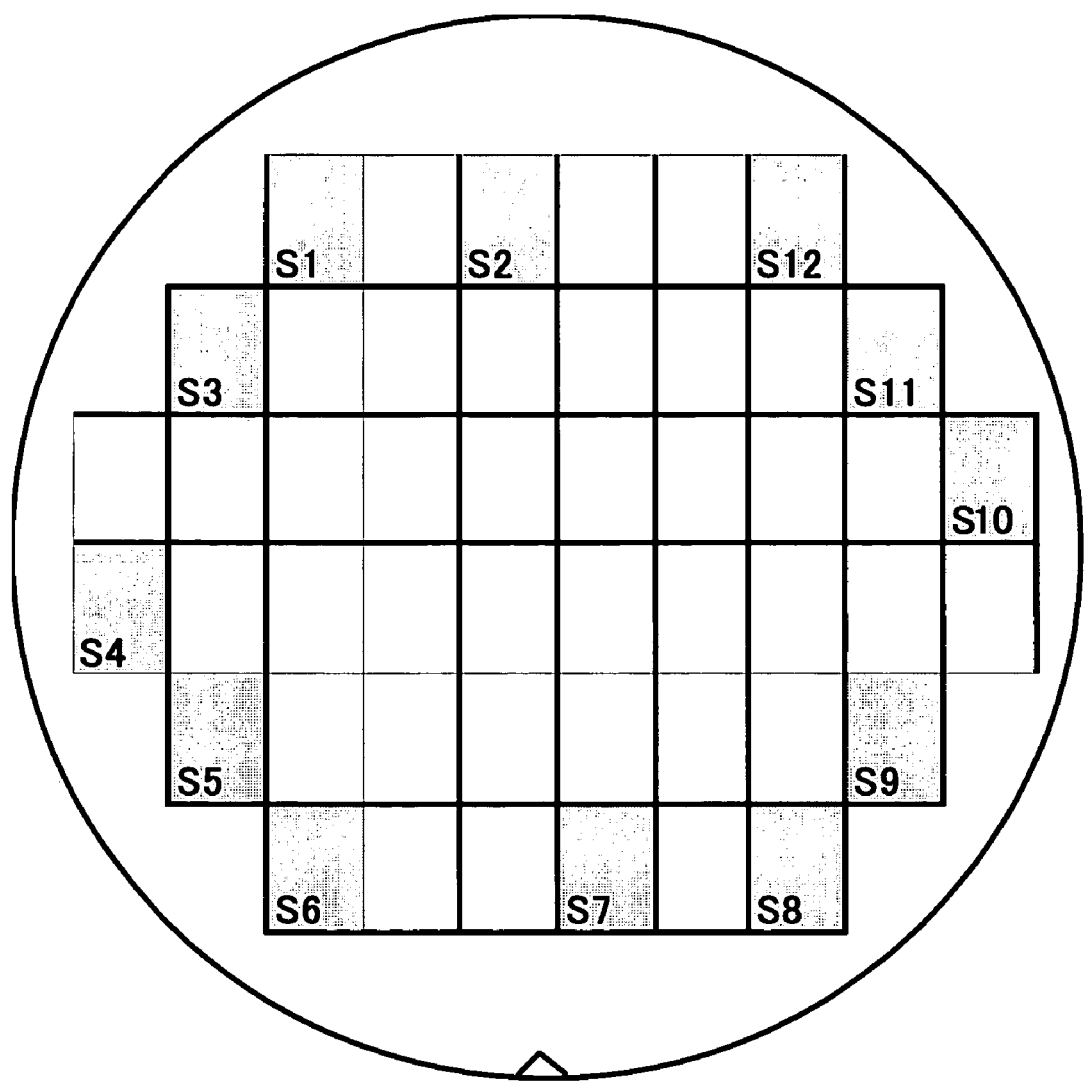
FIG. 11 is a view showing a selection method for sample shots.

Referring now to FIGS. 11 and 1, a description will be given of how the positional measurement reproducibility of the alignment mark 30 (or the mark-element interval reproducibility) and the number of AGA sample (or measurement) shots affect the alignment accuracy for all the shots.

FIG. 11 is a plane view of the wafer 12 having a diameter of Φ200 mm and 48 shots, and selects 12 shots S1 to S12 close to the outer circumference as sample shots. This shot layout used the following simulation to obtain a relationship between the mark-element interval reproducibility, and the alignment accuracy:

1) The number of AGA sample shots and their positions are determined.

2) A regular random number of the standard deviation σ is provided one by one as a measurement value of each mark element 31 for each sample shot. More specifically, a random number is substituted for the measurement value and a final error is estimated.

3) A position of the alignment mark is calculated for each AGA sample shot.

4) The AGA parameters (Sx, Sy, θx, θy, Bx, By) are calculated from Equations 8 and 9.

5) Positional offset amounts for 48 shots in FIG. 11 is calculated based on the AGA parameters in item 4).

6) Items 2) to 5) are repeated.

7) The scatter 3σ of the positional offset amount calculated in item 5) is calculated.

8) Turning back to item 1), items 2) to 7) are repeated after the number of sample shots is changed.

FIG. 1 shows a calculation result obtained from this simulation. The abscissa axis in FIG. 1 converts the scatter σx of the measurement values of the mark elements provided by item 2) into the mark-element interval reproducibility using Equation 13. As shown in FIG. 1, when the number of AGA sample shots is the same, the mark-element interval reproducibility is in a direction proportion to the alignment accuracy; as the number of AGA sample shots increases the inclination becomes moderate because of the averaging effect with the increased number of samples for calculating the AGA parameters (Sx, Sy, θx, θy, Bx, By). Only four AGA sample shots are enough for the user-required alignment accuracy of 15 nm, as shown in FIG. 1, and the mark-element interval reproducibility of 25 nm, whereas 12 AGA samples shots are needed for the mark-element interval reproducibility of 25 nm.

As discussed in detail above, the number of necessary sample shots can be determined with the mark-element interval reproducibility and the alignment accuracy required by a user of the apparatus.

A concrete description will now be given of a method for determining the number of AGA sample shots from the mark-element interval reproducibility. There are two types of methods for determining the number of AGA sample shots as follows:

The first method is one that provides regular random numbers as measurement values of the mark element 31 for statistic calculations, and calculates the alignment accuracy.

Similar to the above simulation, this method calculates a relationship between the mark-element interval reproducibility and the alignment accuracy for each sample shot number, calculates a proportional equation shown in FIG. 1, and determines the number of sample shots from the necessary alignment accuracy. As shown in FIG. 1, there is a linear relationship between the mark-element interval reproducibility and the alignment accuracy. Therefore, only one standard deviation, for example, $3\sigma x=20$ nm, is enough for the regular random number given as a distribution of the measurement values of the mark elements 31.

Thus, prior to the AGA measurements, a relational equation between the mark-element interval reproducibility and the alignment accuracy is obtained based on exposure shot information and AGA sample shot information. An AGA sequence will be detailed later.

The AGA measurement detects positions of the mark elements 31 in the alignment marks for the predetermined number (n) of sample shots. Equations 10 to 12 calculate the mark-element intervals, and the standard deviation $3\sigma L$. For reduced influence of design errors of the mark elements in the alignment mark or reticle patterning errors, it is preferable to calculate an average for each of the mark-element intervals L1 to L3, and then obtain the scatter of differential values from these averages. In other words, Equations 15 to 17 below calculate the standard deviation using $dL1(i)$, $DL2(i)$ and $DL3(i)$ as samples, and obtain the mark-element interval reproducibility $\sigma L$:

$$dL1(i) = L1(i) - \frac{1}{m}\sum_{i=1}^{m} L1(i) \quad (15)$$

$$dL2(i) = L2(i) - \frac{1}{m}\sum_{i=1}^{m} L2(i) \quad (16)$$

$$dL3(i) = L3(i) - \frac{1}{m}\sum_{i=1}^{m} L3(i) \quad (17)$$

The first method can more strictly obtain a relationship between the mark-element interval reproducibility and the alignment accuracy, but has a disadvantage in that it takes an extra calculation time so as to generate regular random numbers, etc.

The second method is one that previously determines the following equation, and obtains the number of necessary sample shots based on this equation. A description will be given of a method of guiding this equation. Equation 18 below results from Equation 14 where M1 is the measurement reproducibility or accuracy of one alignment mark, Mr is the mark-element interval reproducibility, and Nm is the number of mark elements 31 included in the alignment mark 30.

$$M1 = \frac{Mr}{\sqrt{2Nm}} \quad (18)$$

The alignment accuracy Ar can be approximated as follows where M1 is the measurement reproducibility of one alignment mark 30, and Ns (which is a natural number equal to or greater than 3) is the number of AGA sample shots:

$$Ar = M1 \cdot \sqrt{3/Ns} \quad (19)$$

Equation 19 means that when the number of sample shots Ns is 3, there is no averaging effect and it becomes the same value as the measurement reproducibility of one alignment mark; when the number of sample shots Ns is equal to or greater than 4, the averaging effect makes the entire alignment accuracy better than the measurement reproducibility of one alignment mark.

Equation 20 is a relational equation that defines a relationship between the mark-element interval reproducibility Mr and the alignment accuracy Ar from Equations 18 and 19:

$$Ar = Mr \cdot \sqrt{3/(2NsNm)} \quad (20)$$

$$Ns \geq [3/(2Nm)] \cdot (Mr/Ar)^2 \quad (21)$$

Therefore, the number of sample shots Ns, which satisfies the necessary alignment accuracy Ar is designed to select the minimum natural number that meets Equation 21. Equation 21 can express its right side as $\alpha \cdot f(Nm, Mr, Ar)$ using a function of Nm, Mr and Ar, where $\alpha$ is a corrective coefficient determined by the number of AGA measurement shots and the shot arrangement and becomes 1.5 in Equation 21. When the alignment accuracy is more stressed than the throughput, a value of $\alpha$ can be set to be larger, although $\alpha$ can be set within a range from 1.0 to 3.0.

Figure 12:
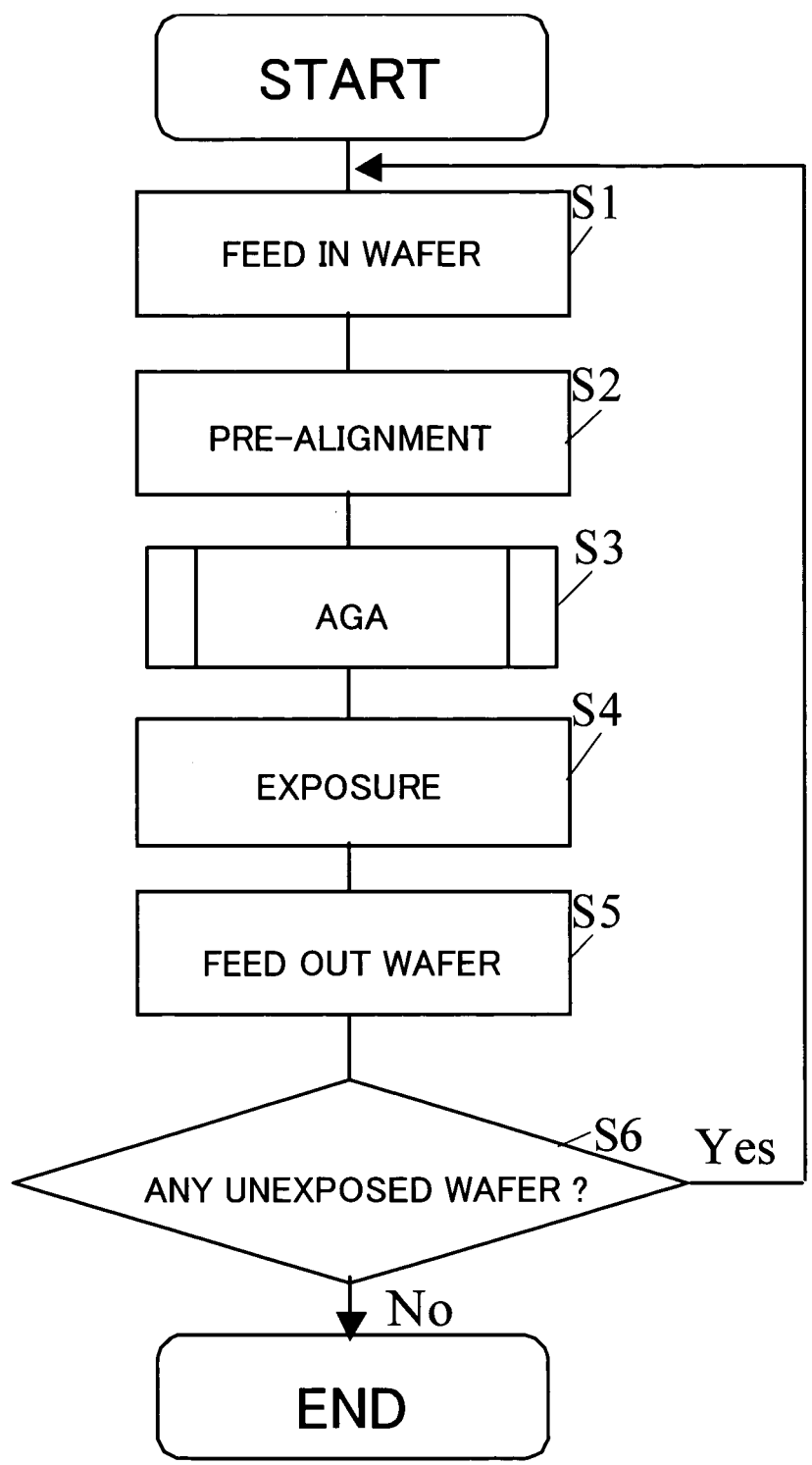
FIG. 12 is a flowchart of an exposure sequence to be executed by the exposure apparatus shown in FIG. 2.

Referring now to FIG. 12, a description will be given of an exposure sequence of the exposure apparatus 1 of the instant embodiment. First, the wafer 12 is fed in (step S1), and a pre-alignment aligns the wafer with the exposure apparatus 1 so that the alignment mark 30 can be located on the wafer 12 within a detectable range of the alignment optical system 15 (step S2). Then, the AGA follows as detailed later (step S3). After the AGA positions the wafer 12 relative to the exposure apparatus 1, the exposure starts (step S4). When all the shots on the wafer are exposed, the exposed wafer is fed out of the exposure apparatus (step S5), and it is determined that whether there is an unexposed wafer (step S6). If there is, the procedure is fed back to and begins with the step S1 until there is no unexpected wafer.

Figure 13:
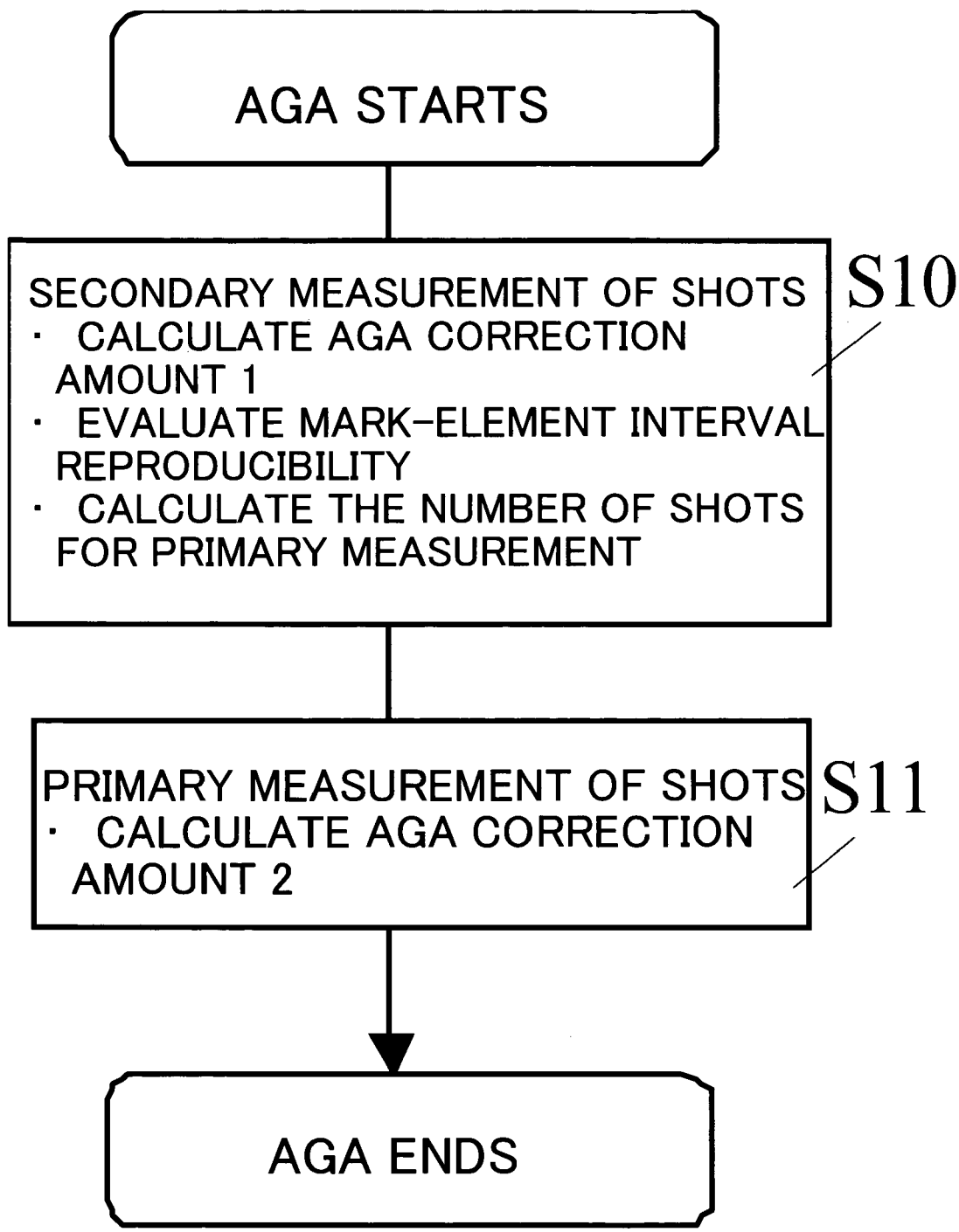
FIG. 13 is a flowchart of a detailed sequence of step 3 shown in FIG. 12.

Referring now to FIG. 13, a detailed description will be given of the AGA sequence of the instant embodiment. Started first is the secondary measurement of AGA shots (step 10). The secondary shot-measurement is to bring an absolute value of the subsequent primary measurement close to zero (for example, below 100 nm) although the secondary shot-measurement has measurement values below 4 μm since the pre-alignment shown in FIG. 12 has roughly aligned the wafer. A narrowed measurement range in the primary measurement would be less susceptible to influence of the non-linear errors and magnification fluctuation errors of the measurement values of the mark positions relative to the positional offsets of the alignment marks. The secondary shot-measurement measures positions of the alignment marks for, for example, four shots on the wafer, and calculates first AGA corrective parameters from Equations 8 and 9. It also calculates the mark-element intervals from the positional measurement values of respective mark elements in the alignment mark, and determines the number of AGA sample shots for primary measurement so as to satisfy the necessary alignment accuracy input by a user. Then, the wafer is aligned using an AGA corrective amount 1 calculated in step S10, and positions of the sample shots are calculated by the number of shots for the primary measurement calculated in step S11, and an AGA corrective amount 2 is calculated from Equation 8 and 9 (step S11). Then, the wafer is aligned based on the AGA correction amount 2 and the exposure follows.

Figure 14:
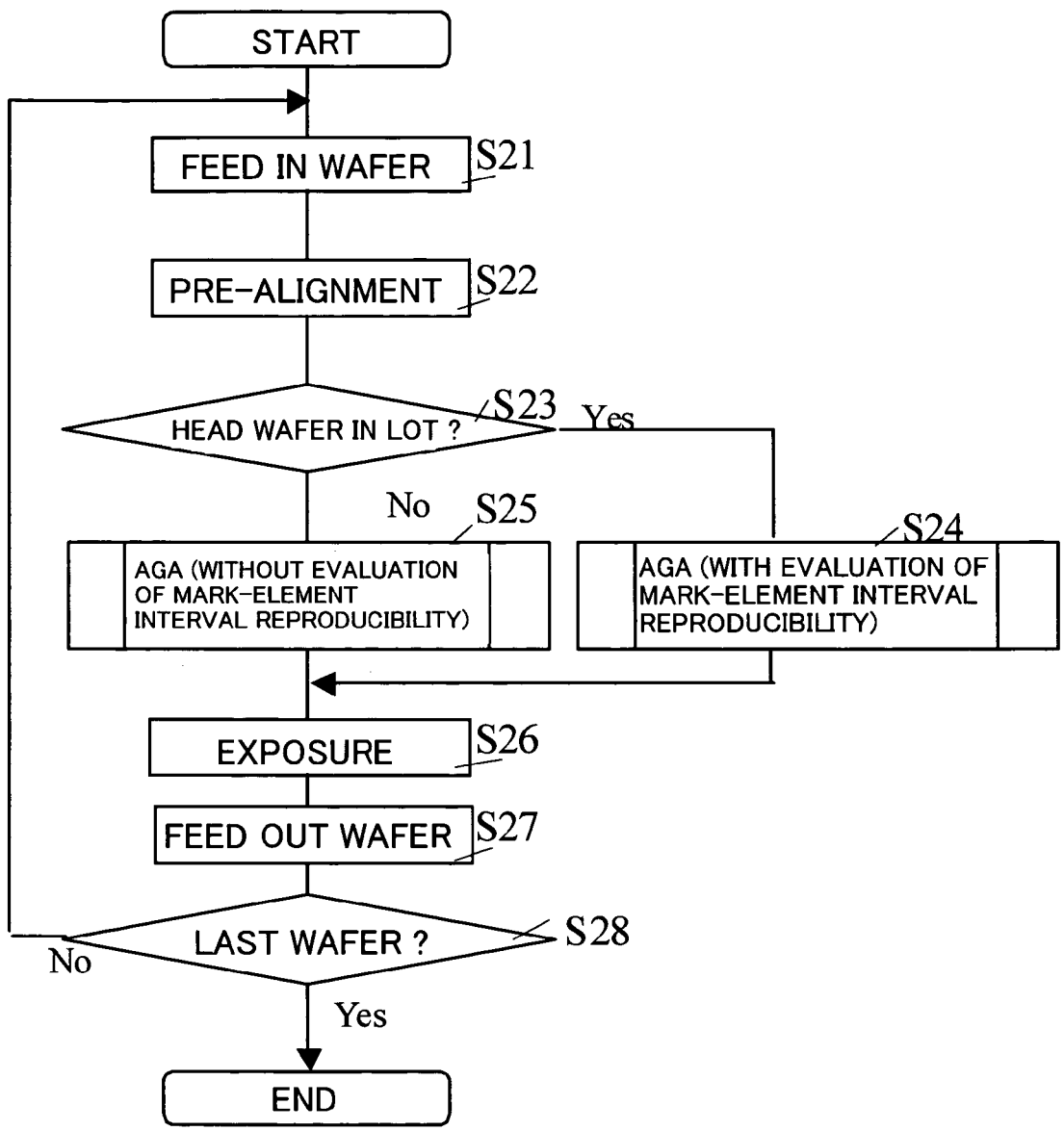
FIG. 14 is a flowchart showing a variation of the exposure sequence shown in FIG. 12.

FIG. 14 shows a variation of the exposure sequence by the exposure apparatus of the instant embodiment, which emphasizes the throughput. First, the wafer 12 is fed in (step S21), and a pre-alignment aligns the wafer 12 with the exposure apparatus 1 so that the alignment mark 30 can be located on the wafer 12 within a detectable range of the alignment optical system 15 (step S22). It is then determined whether this wafer is a head wafer in the lot (step S23). If so, the above method evaluates the mark-element interval reproducibility (step S24), and the number of AGA sample shots is determined and stored in the exposure apparatus. AGA starts based on the determined number of sample shots, and the wafer is exposed (step S26). AGA takes place for a wafer that is determined not to be a head wafer in the lot in step S23, using the number of AGA sample shots stored in the exposure apparatus in step S24, while the mark-element interval reproducibility is not evaluated (step S25) and the wafer is exposed (step S26). The exposed wafer is fed out of the exposure apparatus 1 (step S28), and whether it is the last wafer is determined (step S28). If it is not the last wafer, the procedure returns to step S21. Thus, the number of sample shots is determined only for the head wafer in the lot, eliminating an extra alignment time.

Thus, the apparatus itself can evaluate the accuracy of the measurement values of the alignment mark 30 and automatically determine the number of AGA measurement shots according to the necessary alignment accuracy by detecting positions of respective mark elements 31, and calculating intervals between mark elements 31. While the instant embodiment uses the standard deviation σas a scatter amount of the measurement values of the interval between the mark elements 31 for the measurement reproducibility of the alignment mark 30, use of the range (between the maximum value to the minimum value) of the scatter amount of the measurement values of the interval between the mark elements 31 would provide similar effects.

Figure 15:
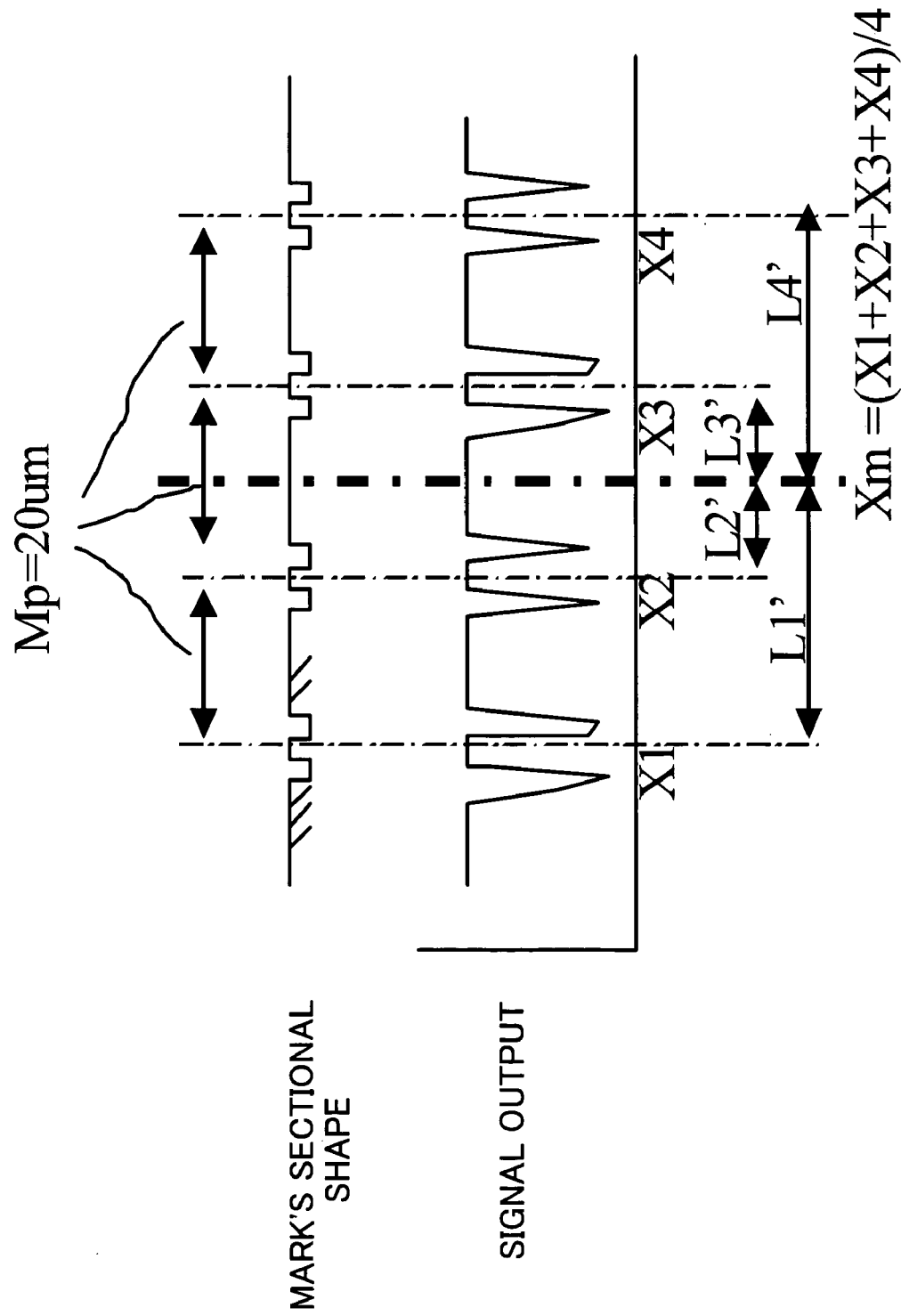
FIG. 15 is a view for explaining another embodiment according to the present invention.

A description will now be given of the second embodiment according to the present invention, which uses the same shaped alignment mark 30 and the same alignment detection systems 15 to 17 but uses a different method for calculating the positional detection accuracy of the alignment mark 30. Since this embodiment uses the same method for determining the number of AGA sample shots and the same exposure method after the positional detection accuracy is calculated, a description thereof will be omitted. Referring to FIG. 15, a description will be given of a method for calculating the positional detection accuracy of the alignment mark 30 according to the present invention.

In FIG. 15, a signal output has a measurement value X1 of the mark element number 1, a measurement value X2 of the mark element number 2, a measurement value X3 of the mark element number 3, and a measurement value X4 of the mark element number 4. Xm is a measurement value of the alignment mark (=(X1+X2+X3+X4)/4), and Mp is a design value of an interval between the mark elements.

While the first embodiment uses the mark-element interval as an accuracy evaluation value to evaluate the detection accuracy of the alignment mark 30, this embodiment differently uses the average Xm of positional measurement values of all the mark elements (=measurement values of the alignment mark 30) and a differential value (or a distance) from each mark element 31 as an accuracy evaluation value as detailed below:

First, the alignment marks 30 are measured for several shots, and a difference between a designed value and an actual distance between the alignment-mark measurement value Xm and each mark-element positional measurement value is calculated by the following equations:

$$dL1'(i)=Xm(i)-X1(i)-1.5Mp \quad (22)$$

$$dL2'(i)=Xm(i)-X2(i)-0.5Mp \quad (23)$$

$$dL3'(i)=X3(i)-Xm(i)-0.5Mp \quad (24)$$

$$dL4'(i)=X4(i)-Xm(i)-1.5Mp \quad (25)$$

Coefficients of 1.5 and 0.5 in Equations 22 to 25 denote distances from the mark center as shown in FIG. 15, and "i" denotes an AGA measurement shot number. The standard deviation σL' is calculated with dL1'(i), dL2'(i), dL3'(i) and dL4'(i) as samples. The instant embodiment can express a relationship between the standard deviation dL' and the alignment-mark positional measurement reproducibility σax using relationships σL'$^2$=σX$^2$+σax$^2$ and σax=σx/2 where σx is the measurement reproducibility of positions of respective mark elements as follows:

$$3\sigma ax = \frac{3\sigma L'}{\sqrt{5}} \quad (26)$$

The equation below is met for the alignment mark with "n" mark elements:

$$3\sigma ax = \frac{3\sigma L'}{\sqrt{n+1}} \quad (27)$$

Therefore, the instant embodiment leads the following equation from Equation 27 where M1 is the measurement reproducibility (or accuracy) of one alignment mark, and Mr is the accuracy evaluation value (that is reproducibility of a difference between a designed value and an actual distance between the alignment-mark measurement value Mp and each mark-element positional measurement value):

$$M1 = \frac{Mr}{\sqrt{Nm+1}} \quad (28)$$

Here, as discussed above, Nm is the number of mark elements 31 included in the alignment mark 30. Since Equation 19 expresses the AGA alignment accuracy Ar with Ns sample shots (where Ns is a natural number equal to and greater than 3) for the measurement reproducibility of one alignment mark M1, Equations 28 and 19 provide a relational equation between the accuracy evaluation value reproducibility Mr and the alignment accuracy Ar as follows:

$$Ar=\sqrt{3/[(Nm+1)\cdot Ns]}\cdot Mr \quad (29)$$

Therefore, the number of sample shots Ns that meets the necessary alignment accuracy Ar is selected as the minimum natural number that satisfies the following equation:

$$Ns \geq [3/(Nm+1)]\cdot(Mr/Ar)^2 \quad (30)$$

Although the alignment mark 30 in the instant embodiment forms an arrangement at a regular pitch Mp, as shown in FIG. 15, the present invention is applicable to a mark that arranges mark elements at irregularly designed intervals.

Figure 16:
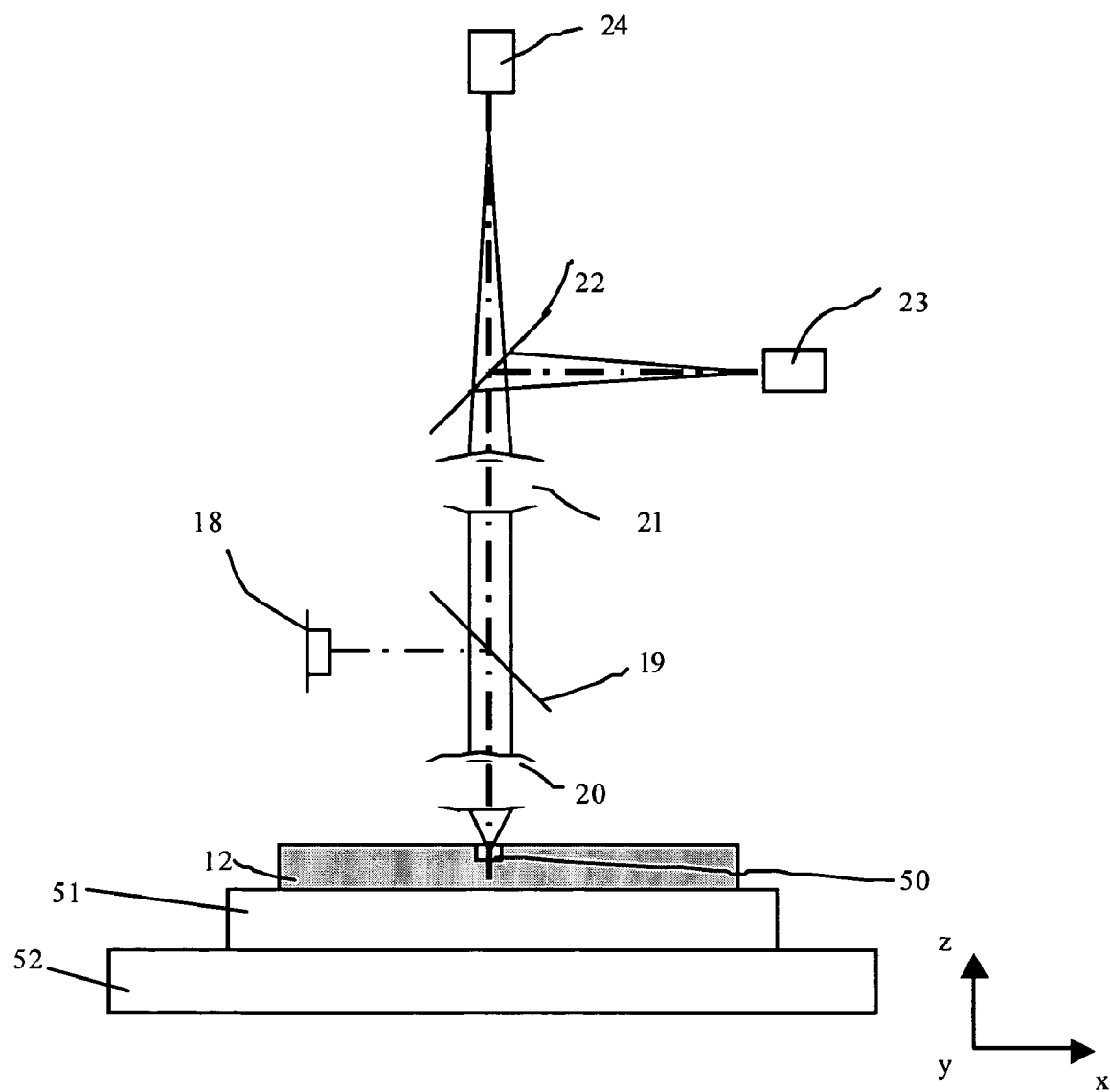
FIG. 16 is a view showing a structure of an overlay inspection apparatus according to the present invention.

Referring now to FIG. 16, a description will be given of a third embodiment according to the present invention. Here, FIG. 16 is an optical path diagram showing principal elements in an overlay inspection apparatus of the third embodiment according to the present invention. The overlay inspection apparatus is one that inspects an overlay state between first and second patterns on a wafer that forms a film on the first pattern, and the second pattern on the film. The illumination light from a light source 18 is reflected on a beam splitter 19, and passes through a lens 20, and illuminates an inspection mark 50 on the wafer 12. The diffracted light from the overlay inspection mark 50 passes through the lens 20, the beam splitter 19, and the lens 21 split by a beam splitter 22, and received by area sensors 23 and 24. The overlay evaluation mark 50 is imaged on the area sensors 23 and 24 at an imaging magnification of about 100 times. The area sensors 23 and 24 are used to measure offsets of the overlay inspection mark 50 in directions X and Y, respectively, and arranged at a rotational angle of 90.degree. relative to the optical axis. The wafer 12 is held by the wafer chuck 51, and an XY stage can position a predetermined position on the wafer 12 relative to the detection system 15. Since X and Y directions adopt the same measurement principle, a description of the positional measurement only in the X direction will be given.

Figure 17:
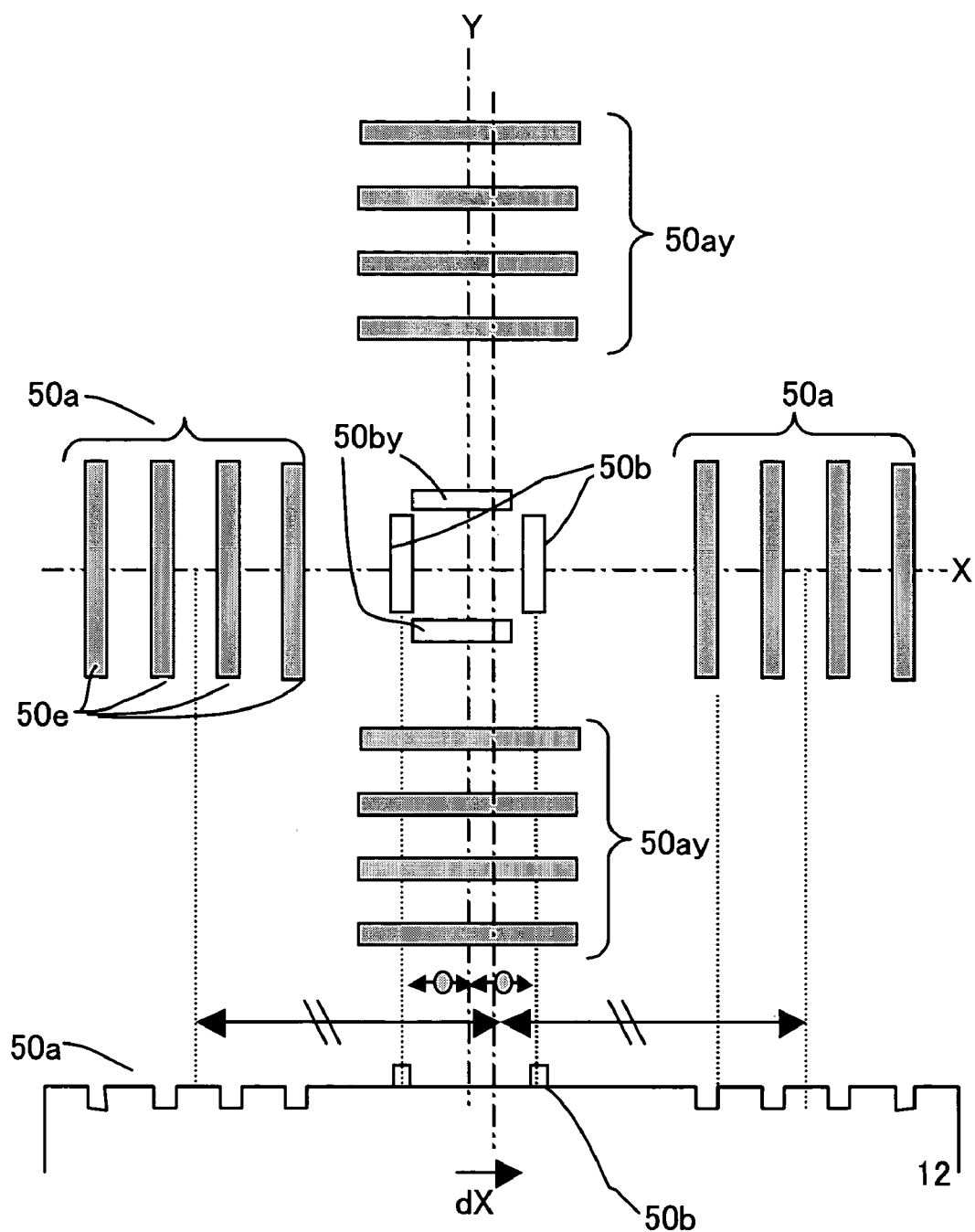
FIG. 17 is a view showing measurement marks used for the inventive overlay inspection apparatus.

The overlay inspection mark 50 is arranged on a scribe line for each shot on the wafer and may have, for example, a shape shown in FIG. 17. In FIG. 17, it uses two measurement mark 50a as a primary mark indicative of a layer position in the pretreatment in the semiconductor manufacture process by arranging them in the direction X at a pitch of 30 μm. The measurement mark 50A arranges four rectangular mark elements 50e at a pitch of 5 μm, each of which has a size of a width of 1 μm in a measurement direction or the direction x and 15 μm in a non-measurement direction or a direction Y.

In addition, it uses two rectangular marks 50b having a width of 1 μm in the direction x and 7 μm in the direction y as a non-measurement direction, as a mark indicative of a current layer position after positioned relative to the evaluation mark for the pretreatment at a pitch of 10 μm inside the primary mark 50a. The primary mark 50a is an etched mark produced in the semiconductor manufacture process, while the mark 50b is a resist pattern indicative of the current layer position. The previous layer position Xma is calculated as a center position of the measurement values of two measurement marks 50a, while the position Xmb of the current layer (resist pattern) is calculated as an average position of the measurement values of two rectangular marks 50b. Therefore, a positional offset of the current layer relative to the previous layer is calculated as a difference dx between a center position of the measurement values of these two measurement marks 50a and an average position of the measurement values of the two rectangular marks 50b. A similar process is conducted for the direction y by measuring positions of measurement marks 50ay and 50by that are rotated measurement marks 50a and 50b in the direction x by 90°, and calculating an offset amount dy between the center position of the two measurement marks 50ay and the center position of two measurement marks 50by.

Since the measurement marks 50b and 50by are resist patterns that are measurement marks extremely well shaped and non-scattering among shots, and have very good detection accuracy (or reproducibility). On the other hand, the measurement marks 50a and 50ay are susceptible to influence of the semiconductor manufacture processing, and tend to be different in shape among shots and wafers.

Similar to the global alignment described for the first embodiment, the inventive overlay inspection apparatus does not measure all the shots on the wafer, but detects measurement marks for plural shots equal to and greater than 3. The apparatus calculates a positional offset (dx(i), dy(i))=(Xmb(i)−Xmb(i)), where "i" is a shot number, substitutes values of dx(i) and dy(i) for xi and yi in Equations 8 and 9, and obtains the corrective parameters (Sx, Sy, θx, θy, Bx, By). The exposure apparatus 1 generally uses the global alignment as the alignment method, and the overlay inspection apparatus outputs an arrangement error of the current layer relative to the shot arrangement of the previous layer in the same order of the corrective parameters for the global alignment.

A relationship is shown among the measurement accuracy $3\sigma ax$ of the average Xma of the measurement values of two measurement marks 50a, the measurement reproducibility $\sigma x$ of the measurement mark 50a, the measurement reproducibility $\sigma e$ of one mark element in the measurement mark 50a, and the reproducibility $\sigma L$ of the mark-element intervals. The mark-element interval is a difference between mark-element measurement values, and thus given by the following equation:

$$\sigma L^2 = \sigma e^2 + \sigma e^2 \tag{31}$$

The measurement value of the measurement mark 50a is an average of four mark-element measurement values, and thus the following equation is met:

$$\sigma x = \sigma e/2 \tag{32}$$

Since an average position of these two measurement marks becomes the mark position Xma in the previous layer, the following equation is met:

$$3\sigma ax = 3\sigma x/mt;epmrl;\sqrt{2rlxmx} \tag{33}$$

Equations 29 to 31 provides a relational equation between the detection accuracy of the mark position in the previous layer and the mark-element interval reproducibility as follows:

$$\sigma ax = \sigma L/4 \tag{34}$$

Therefore, the detection accuracy of the mark position in the previous layer becomes a quarter value of the mark-element interval reproducibility, and the apparatus can itself evaluates the accuracy of the measurement values by evaluating the mark-element interval reproducibility.

A description will now be given of a method for calculating the mark-element interval reproducibility. First, the measurement marks for some shots on the wafer are measured to obtain intervals among mark elements in the measurement mark 50a and 50ay for each shot in the previous layer. Then, after design values of the mark-element intervals (which are 5 μm in the instant embodiment) are subtracted from the interval measurement values, a scattering width (or standard deviation σL) of these values is obtained. The following equation results from Equation 34 where M1 is the measurement reproducibility (or accuracy) for one shot, and Mr is the mark-element interval:

$$M1 = Mr/4 \tag{35}$$

Similar to Equation 19, the following equation can express the overlay inspection accuracy Kr for overlay accuracy to Ns measurement shots, where Ns is a natural number equal to or greater than 3, and M1 is the measurement reproducibility for one shot:

$$Kr = M1 \cdot \sqrt{3/Ns} \tag{36}$$

Equations 35 and 36 define a relational equation between the mark-element interval reproducibility Mr and the overlay inspection accuracy Kr as follows:

$$Kr = Mr \cdot \sqrt{3/(8Ns)} \qquad (37)$$

Therefore, the number of measurement shots Ns that satisfies the necessary overlay inspection accuracy Kr is the minimum natural number that satisfies the following equation:

$$Ns \geq 3/8 \cdot (Mr/Kr)^2 \qquad (38)$$

For example, if the mark-element interval reproducibility Mr is 10 nm and the necessary overlay inspection accuracy Kr is 2 nm, Equation 38 calculates that the number of minimum necessary measurement shots is 10 shots.

Figure 18:
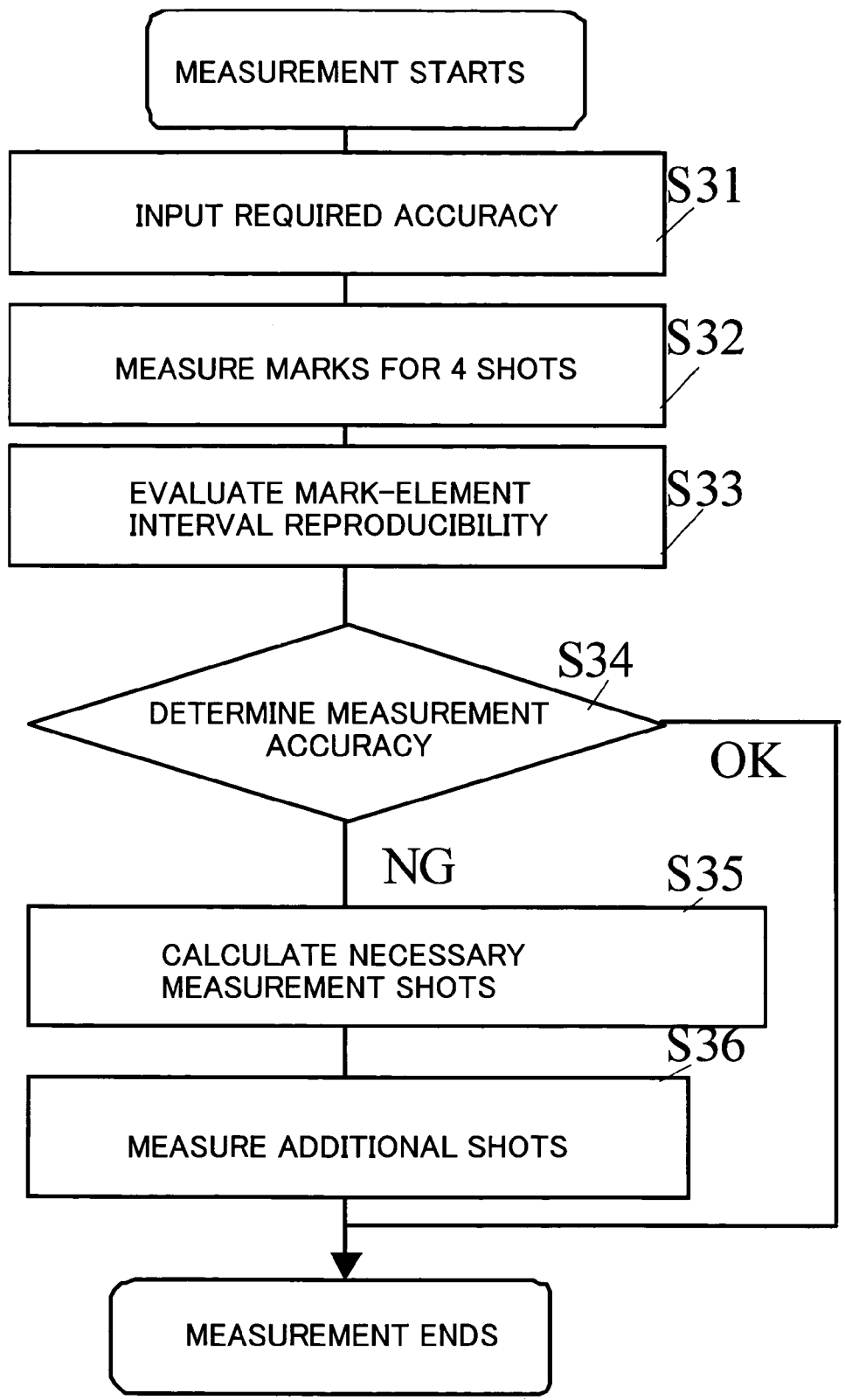
FIG. 18 is a flowchart showing a measurement sequence of the inventive overlay inspection apparatus.

FIG. 18 shows a measurement sequence of the instant overlay inspection apparatus. A user registers the necessary overlay inspection accuracy in the apparatus (step S31). Then, the measurement marks are measured for four shots (step S32). The mark-element interval reproducibility is evaluated from the measurement positions of the mark elements for four shots (step S33). The necessary number of measurement shots is determined based on Equation 34 and the value of the mark-element interval reproducibility. When the step S34 determines that the measurement accuracy meets the accuracy registered in the step S31, the overlay measurement result (Sx, Sy, θx, θy, Bx, By) is stored based on the measurement values for four shots, and the measurement ends. When the step S34 determines that the measurement accuracy is insufficient, the number of additional necessary shots is calculated (step S35), and the additional shots are measured (step S36). The overlay measurement result (Sx, Sy, θx, θy, Bx, By) including the measurement values of the additional measurement shots is stored, and the measurement ends.

The instant embodiments automatically calculates the minimum necessary shots for the alignment measurement that satisfies the alignment accuracy as required by a user, even when alignment marks structurally scatter among shots for the global alignment. Thus, the instant embodiment prevents the throughput reduction, is less susceptible to influence of alignment-mark structural changes during the semiconductor manufacture process, satisfies the required alignment accuracy, and improves the yield in the semiconductor device manufacture process. The instant embodiment also shortens a time necessary to condition the semiconductor manufacture process for stable shape of the alignment mark, and thus improve the productivity of the semiconductor device manufacture. The instant embodiment can reduce measurement errors caused by differently producible overlay inspection marks in the semiconductor manufacture process when applied to the overlay inspection apparatus for the semiconductor manufacture process, determines more accurately whether the product is good or bad, reflects the measurement values as offsets on the exposure apparatus, and improves the overlay accuracy.

Further, the present invention is not limited to these preferred embodiment, and various modifications and variations are may be made without departing from the scope of the present invention.

Thus, the present invention can provide an alignment apparatus and method, and an exposure apparatus, which reconcile the necessary alignment accuracy and throughput even for scattering detection result of an alignment mark

What is claimed is:

1. A method of detecting disposition of a plurality of shot areas on an object, the plurality of shot areas being exposed to a pattern in accordance with the detected disposition, said method comprising:

a first detection step of detecting an alignment mark in the plurality of shot areas, the alignment mark including elements that have an interval therebetween;

an evaluation step of evaluating reproducibility of the interval of the detected alignment mark;

a determination step of determining a number of alignment marks in the plurality of shot areas based on the evaluated reproducibility; and a second detection step of using a detector to detect the disposition of the plurality of shot areas by detecting a plurality of alignment marks in the plurality of shot areas, a number of the plurality of alignment marks having been determined by said determination step, wherein said determination step determines, as the number of alignment marks, a minimum natural number Ns that satisfies $Ns \geq \alpha \cdot (Mr/Ar)^2/Nm$, where Mr is the reproducibility, Nm is a number of the mark elements included in the alignment mark, Ar is required alignment accuracy, and α is a corrective coefficient that is not smaller than 1 and not greater than 3.

2. A method of detecting disposition of a plurality of shot areas on an object, the plurality of shot areas being exposed to a pattern in accordance with the detected disposition, said method comprising:

a first detection step of detecting an alignment mark in the plurality of shot areas, the alignment mark including elements that have an interval therebetween:

an evaluation step of evaluating reproducibility of the interval of the detected alignment mark;

a determination step of determining a number of alignment marks in the plurality of shot areas based on the evaluated reproducibility; and a second detection step of using a detector to detect the disposition of the plurality of shot areas by detecting a plurality of alignment marks in the plurality of shot areas, a number of the plurality of alignment marks having been determined by said determination step, wherein said determination step determines, as the number of alignment marks, a minimum natural number Ns that satisfies $Ns \geq \alpha \cdot f(Nm, Mr, Ar)$, where Mr is the reproducibility, Nm is a number of the elements included in the alignment mark, Ar is required alignment accuracy, α is a corrective coefficient that is not smaller than 1 and not greater than 3, and f(Nm, Mr, Ar) represents a function of Nm, Mr and Ar.

\* \* \* \* \*

UNITED STATES PATENT AND TRADEMARK OFFICE
CERTIFICATE OF CORRECTION

| | | |
|---|---|---|
| PATENT NO. | : 7,190,455 B2 | Page 1 of 1 |
| APPLICATION NO. | : 10/762599 | |
| DATED | : March 13, 2007 | |
| INVENTOR(S) | : Matsumoto | |

It is certified that error appears in the above-identified patent and that said Letters Patent is hereby corrected as shown below:

In col. 14, line 31, replace " $3\sigma ax = 3\sigma x / mt; epmrl; \sqrt{2} rlxmx$ " with -- $3\sigma ax = 3\sigma x / \sqrt{2}$ --.

Signed and Sealed this

Fifth Day of June, 2007

JON W. DUDAS
*Director of the United States Patent and Trademark Office*